US012718868B2

(12) United States Patent
Li et al.

(10) Patent No.: US 12,718,868 B2
(45) Date of Patent: Aug. 25, 2026

(54) THREE-DIMENSIONAL MEMORY DEVICES AND FABRICATING METHODS THEREOF

(71) Applicant: YANGTZE MEMORY TECHNOLOGIES CO., LTD., Wuhan (CN)

(72) Inventors: Danyang Li, Wuhan (CN); Yu Wang, Wuhan (CN); Xu Hou, Wuhan (CN); Zhichao Du, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 197 days.

(21) Appl. No.: 18/660,852

(22) Filed: May 10, 2024

(65) Prior Publication Data

US 2025/0336434 A1 Oct. 30, 2025

(30) Foreign Application Priority Data

Apr. 28, 2024 (CN) ......................... 202410524826.1

(51) Int. Cl.

| | |
|---|---|
| ***G11C 8/14*** | (2006.01) |
| ***G11C 5/06*** | (2006.01) |
| ***G11C 11/408*** | (2006.01) |
| ***G11C 11/4091*** | (2006.01) |

(52) U.S. Cl.

CPC .......... *G11C 11/4085* (2013.01); *G11C 5/063* (2013.01); *G11C 11/4082* (2013.01); *G11C 11/4087* (2013.01); *G11C 11/4091* (2013.01)

(58) Field of Classification Search

CPC ............ G11C 11/4085; G11C 11/4087; G11C 11/4091; G11C 11/2253; G11C 11/2273; G11C 11/4097; G11C 7/18; G11C 8/14; G11C 5/025; H10B 12/50

See application file for complete search history.

(56) References Cited

U.S. PATENT DOCUMENTS

| | | | | |
|---|---|---|---|---|
| 5,448,516 A * | 9/1995 | Tsukikawa | G11C 5/025 365/182 | |
| 2014/0104948 A1* | 4/2014 | Rhie | G11C 11/4085 365/185.11 | |
| 2021/0225425 A1* | 7/2021 | Do | G11C 8/08 | |
| 2024/0079047 A1* | 3/2024 | Choi | G11C 11/4085 | |
| 2024/0170042 A1* | 5/2024 | Yang | G11C 11/4074 | |
| 2025/0151291 A1* | 5/2025 | Park | H10B 80/00 | |

(Continued)

*Primary Examiner* — Mushfique Siddique
(74) *Attorney, Agent, or Firm* — BAYES PLLC

(57) ABSTRACT

A memory device includes a memory array structure having a plurality of memory banks, each memory bank including a plurality of memory groups, each memory group having at least one memory block; and a peripheral structure stacked with the memory array structure in a vertical direction, and having a plurality of memory-group-driver circuits each corresponding to one of the plurality of memory groups, respectively, wherein each memory-group-driver circuit is coupled with word lines of at least one memory block of a corresponding one of memory groups, and overlaps with one of the at least one memory blocks in the vertical direction. Each memory-group-driver circuit may include a precharge-voltage-driver circuit configured to provide a precharge voltage to the word lines, and a discharge-voltage-driver circuit configured to provide a discharge voltage to the word lines.

20 Claims, 30 Drawing Sheets

(56) References Cited

U.S. PATENT DOCUMENTS

| | | | | |
|---|---|---|---|---|
| 2025/0166693 | A1* | 5/2025 | Jung | G11C 11/4085 |
| 2025/0174265 | A1* | 5/2025 | Kim | H01L 23/528 |
| 2025/0227926 | A1* | 7/2025 | Lee | H01L 25/0657 |
| 2025/0356907 | A1* | 11/2025 | Hou | G11C 5/025 |

* cited by examiner

100

X
Y

1700

Form a plurality of memory-group-driver circuits each corresponding to one of a plurality of memory groups, respectively

1702

Form a plurality of first memory-group-driver-interconnect lines configured to couple between a first side of each memory-group-driver circuit and even word lines of the at least one memory block of the corresponding one of the plurality of memory groups

1704

Form a plurality of second memory-group-driver-interconnect lines configured to couple between a second side of each memory-group-driver circuit and odd word lines of the at least one memory block of the corresponding one of the plurality of memory groups

1706

Arrange a subset of the plurality of memory groups in a row along a first lateral direction

1708

Arrange the plurality of the first memory-group-driver-interconnect lines and the plurality of second memory-group-driver-interconnect lines in a same subset of horizontal routing channels along the first lateral direction

1710

A

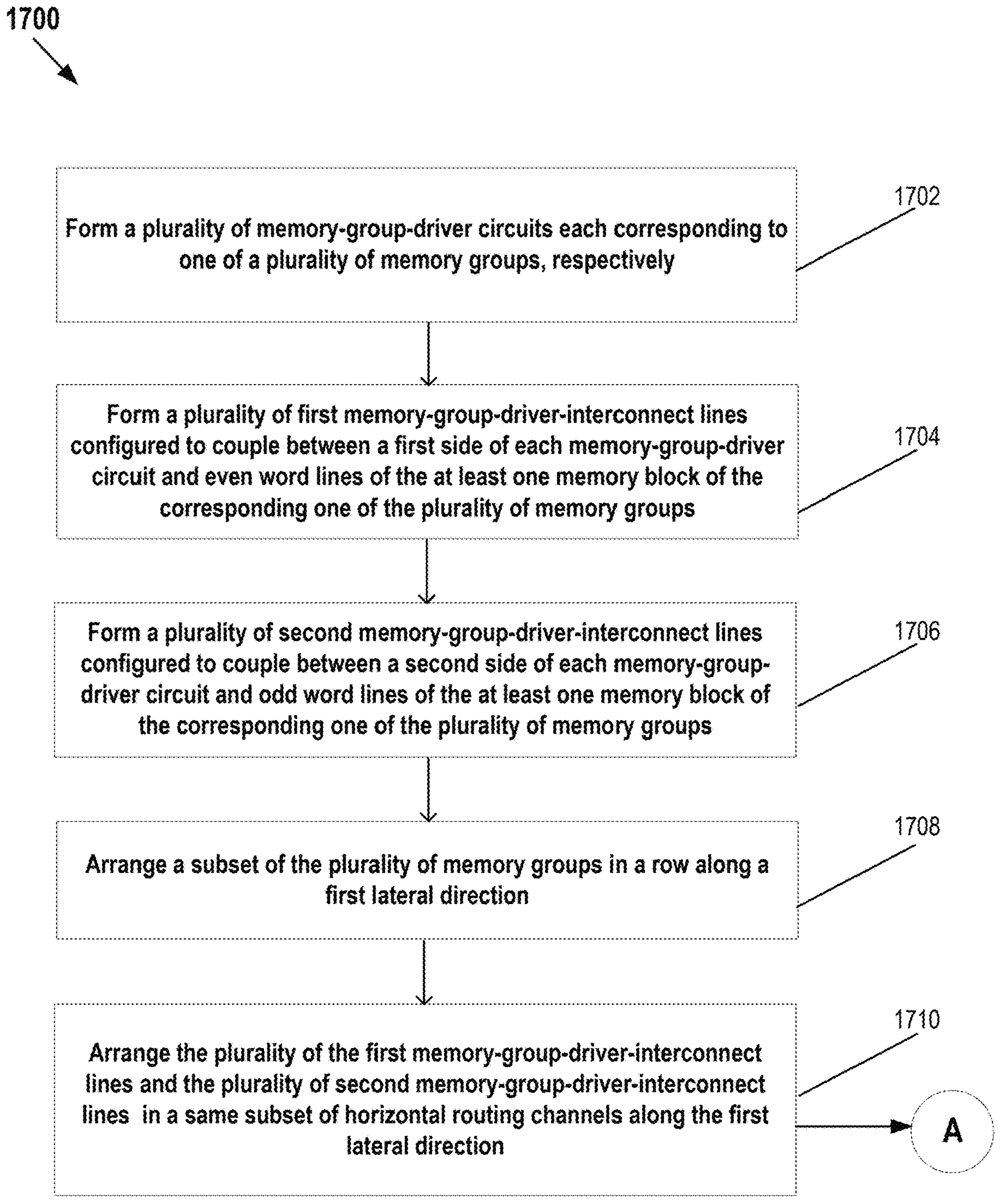

FIG. 17A

Form a plurality of word-line-driver lines, a plurality of Y-decoder circuits, and a plurality of sense amplifier circuits such that after bonding together the memory array structure and the peripheral structure, the plurality of word-line-driver lines are located between adjacent memory blocks, a first subset of word-line-driver lines are connected to even word lines, a second subset of word-line driver lines are connected to odd word lines, each Y-decoder circuit overlaps with a corresponding one memory block in the vertical direction, and each sense amplifier circuit at least partially overlaps with the corresponding one memory block in the vertical direction

1712

Arrange at least one sense amplifier circuit of the plurality of sense amplifier circuits, a first Y-decoder circuit of the plurality of Y-decoder circuits, and one memory-group-driver circuit so as to be sandwiched between the first subset of word-line-driver lines and the second subset of word-line-driver lines in the first lateral direction

1714

Arrange the one memory-group-driver circuit so as to be sandwiched between the at least one sense amplifier circuit and the first Y-decoder circuit in a second lateral direction perpendicular to the first lateral direction

1716

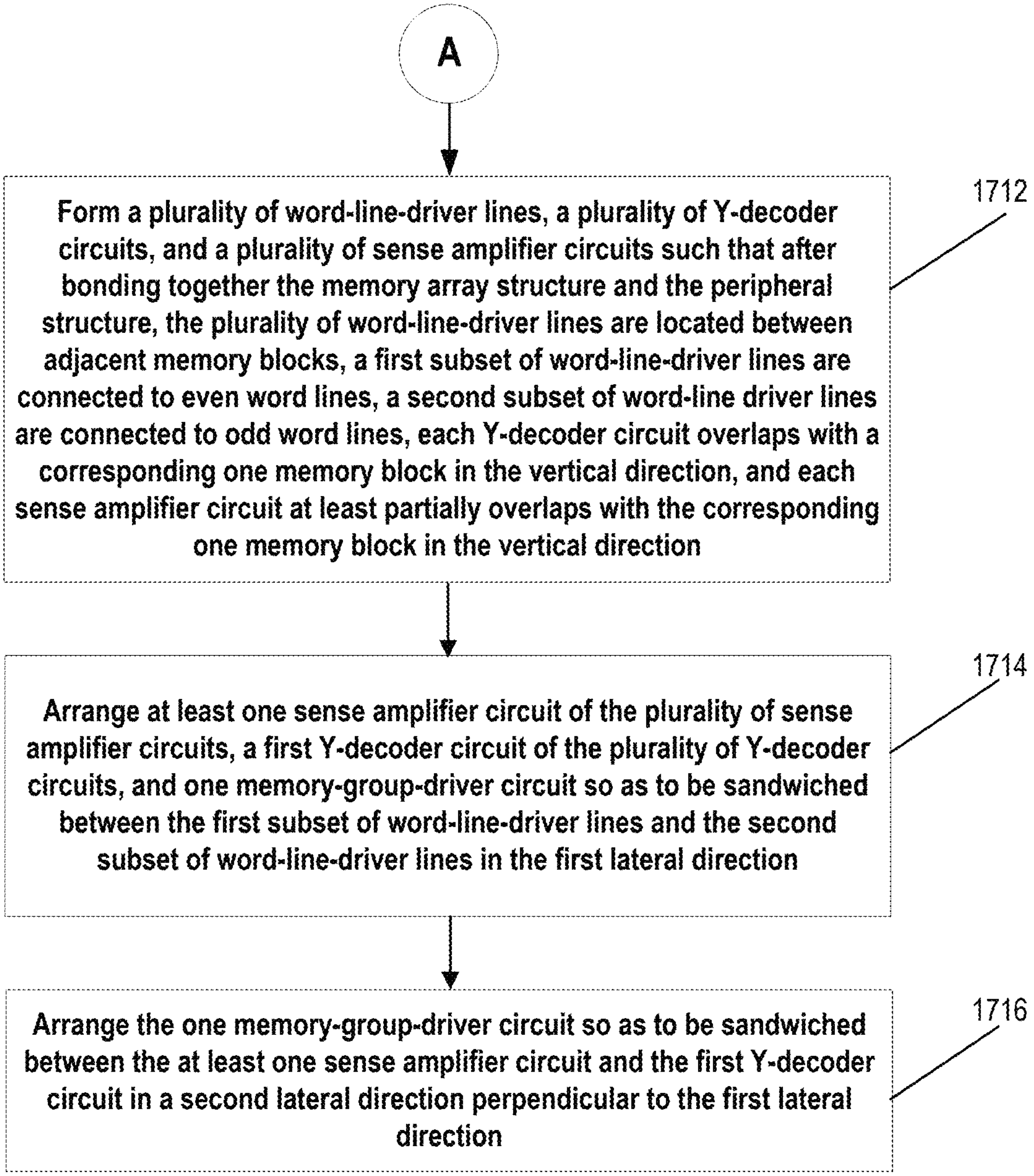

FIG. 17B

Form a plurality of word-line-driver lines, a plurality of Y-decoder circuits, and a plurality of sense amplifier circuits such that after bonding together the memory array structure and the peripheral structure, the plurality of word-line-driver lines are located between adjacent memory blocks, a first subset of word-line-driver lines are connected to even word lines, a second subset of word-line driver lines are connected to odd word lines, each Y-decoder circuit overlaps with a corresponding one memory block in the vertical direction, and each sense amplifier circuit at least partially overlaps with the corresponding one memory block in the vertical direction

1812

Arrange at least one sense amplifier circuit of the plurality of sense amplifier circuits, a first Y-decoder circuit of the plurality of Y-decoder circuits, and one memory-group-driver circuit so as to be sandwiched between the first subset of word-line-driver lines and the second subset of word-line-driver lines in the first lateral direction

1814

Arrange the one memory-group-driver circuit and the first Y-decoder circuit so as to be sandwiched between a first portion of the at least one sense amplifier circuit and a second portion of the at least one sense amplifier circuit in a second lateral direction perpendicular to the first lateral direction

1816

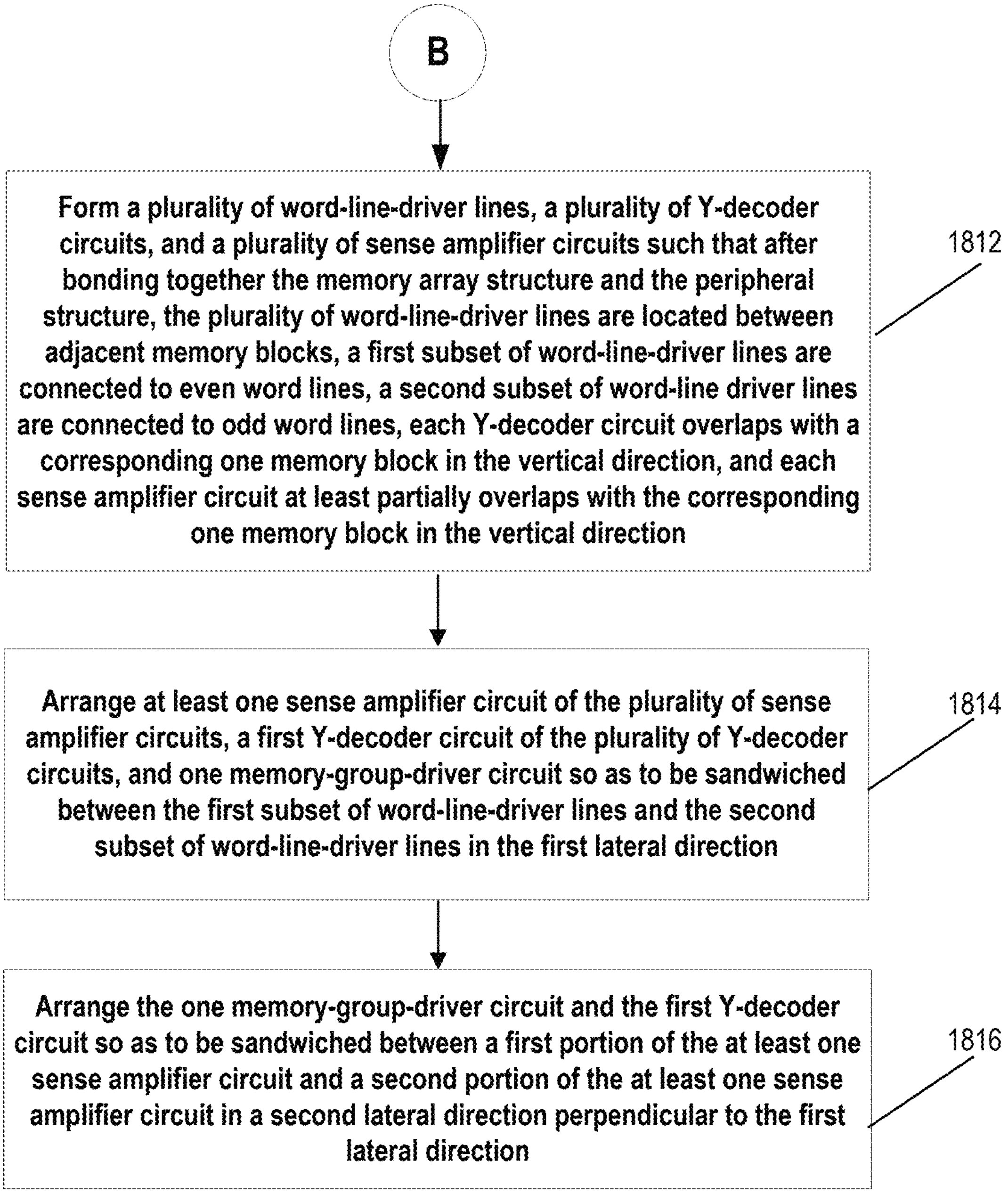

FIG. 18B

Form a plurality of word-line-driver lines, a plurality of Y-decoder circuits, and a plurality of sense amplifier circuits such that after bonding together the memory array structure and the peripheral structure, the plurality of word-line-driver lines are located between adjacent memory blocks, a first subset of word-line-driver lines are connected to even word lines, a second subset of word-line driver lines are connected to odd word lines, each Y-decoder circuit overlaps with a corresponding one memory block in the vertical direction, and each sense amplifier circuit at least partially overlaps with the corresponding one memory block in the vertical direction

1912

Arrange a first Y-decoder circuit of the plurality of Y-decoder circuits and one memory-group-driver circuit so as to be sandwiched between the first subset of word-line-driver lines and the second subset of word-line-driver lines in the first lateral direction

1914

Arrange the plurality of word-line-driver lines, the one memory-group-driver circuit, and the first Y-decoder circuit so as to be sandwiched between a first portion of the sense amplifier circuits and a second portion of the sense amplifier circuits in a second lateral direction perpendicular to the first lateral direction

1916

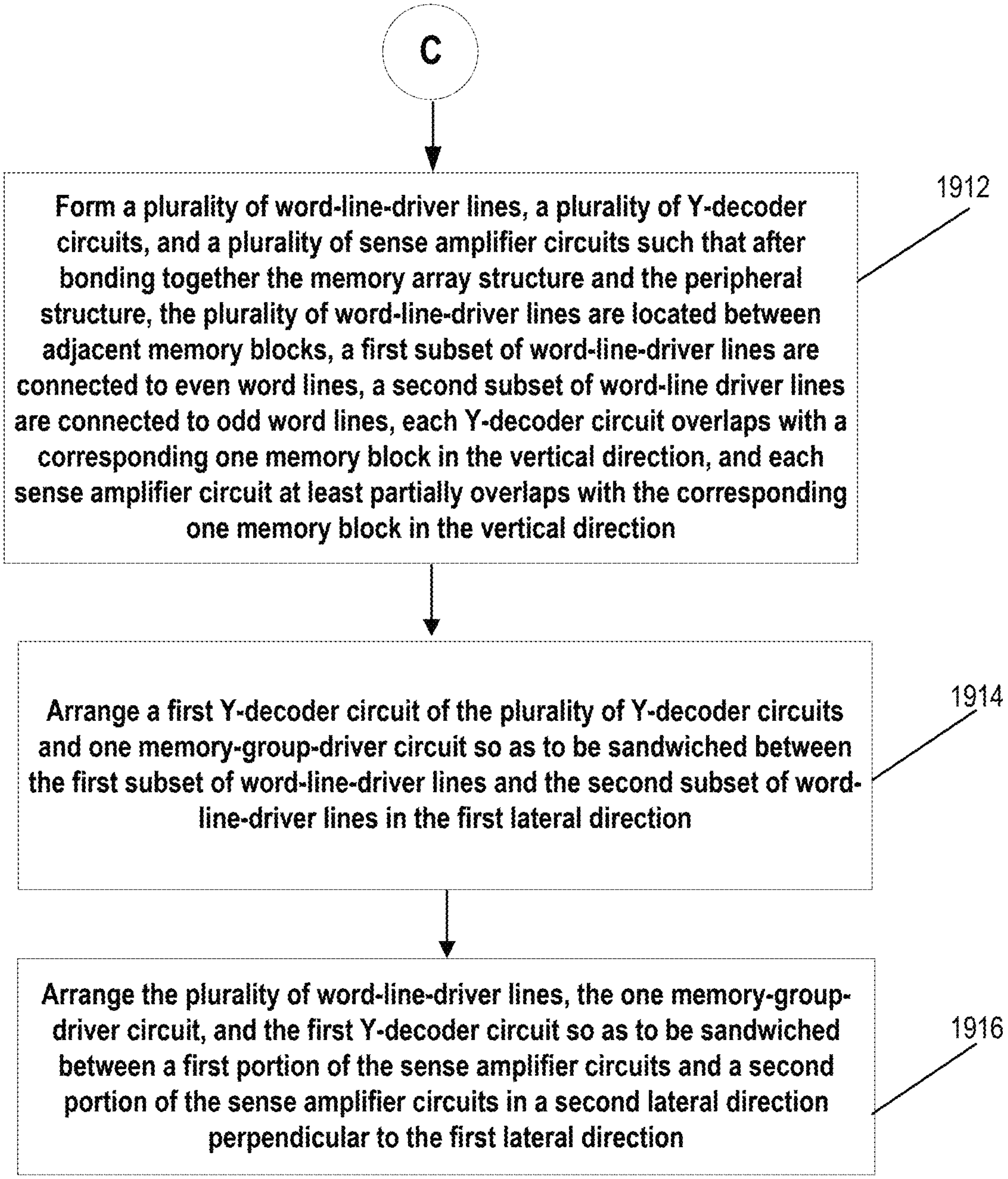

FIG. 19B

THREE-DIMENSIONAL MEMORY DEVICES AND FABRICATING METHODS THEREOF

CROSS-REFERENCE TO RELATED APPLICATIONS

This application claims the benefit of priority to Chinese Application No. 202410524826.1, filed on Apr. 28, 2024, which is incorporated herein by reference in its entirety.

TECHNICAL FIELD

The present disclosure generally relates to the field of semiconductor technology, and more particularly, to semiconductor devices and fabricating methods thereof.

BACKGROUND

The market for semiconductor memory products is very competitive. The ability to reduce the cost of manufacturing a semiconductor memory product increases the profitability of the manufacturer. Moreover, the ability to manufacture a semiconductor memory product at a lower price than a competitor may allow the manufacturer to increase its market share.

One of the ways in which the cost of a semiconductor memory product may be reduced is by reducing the amount of area required to implement the semiconductor memory product.

SUMMARY

According to one aspect of the present disclosure, a memory device comprises: a memory array structure comprising a plurality of memory banks, each of the memory banks comprising a plurality of memory groups, each memory group having at least one memory block; and a peripheral structure stacked with the memory array structure in a vertical direction, and comprising a plurality of memory-group-driver circuits each corresponding to one of the plurality of memory groups, respectively, wherein each memory-group-driver circuit is coupled with word lines of the at least one memory block of a corresponding one of the plurality of memory groups, and overlaps with one of the at least one memory blocks in the vertical direction.

In some implementations, each memory-group-driver circuit comprises: a precharge-voltage-driver circuit configured to provide a precharge voltage to the word lines of the at least one memory block of the corresponding one of the plurality of memory groups.

In some implementations, each memory-group-driver circuit further comprises: a discharge-voltage-driver circuit configured to provide a discharge voltage to the word lines of the at least one memory block of the corresponding one of the plurality of memory groups.

In some implementations, one of the memory-group-driver circuits comprises: a buffer circuit configured to buffer control signals of the precharge-voltage-driver circuit or the discharge-voltage-driver circuit.

In some implementations, the peripheral structure further comprises: a plurality of memory-group-driver-interconnect lines coupled with a corresponding memory-group-driver circuit and one parity of word lines.

In some implementations, a subset of the plurality of memory groups are arranged in a row along a first lateral direction; and the memory-group-driver-interconnect lines coupled with the memory-group-driver circuits of the subset of the plurality of memory groups are arranged in a same subset of horizontal routing channels along the first lateral direction.

In some implementations, a number of the horizontal routing channels in the same subset of horizontal routing channels depends on a number of the word lines of each memory block, and is independent of a number of the memory groups in the subset of the plurality of memory groups.

In some implementations, the peripheral structure further comprises: a first word-line-driver circuit located on a first side of one memory block and coupled with even word lines, and a second word-line-driver circuit located on a second side of the one memory block opposite to the first side and coupled with odd word lines; a Y-decoder circuit that overlaps with the one memory block in the vertical direction; and a sense amplifier circuit that at least partially overlaps with the one memory block in the vertical direction.

In some implementations, the sense amplifier circuit, the Y-decoder circuit and one memory-group-driver circuit are arranged between the first word-line-driver circuit and the second word-line-driver circuit in the first lateral direction, and the one memory-group-driver circuit is arranged between the sense amplifier circuit and the Y-decoder circuit in a second lateral direction perpendicular to the first lateral direction.

In some implementations, the sense amplifier circuit, the Y-decoder circuit and one memory-group-driver circuit are arranged between the first word-line-driver circuit and the second word-line-driver circuit in the first lateral direction, and the one memory-group-driver circuit and the Y-decoder circuit are arranged between a first portion of the sense amplifier circuit and a second portion of the sense amplifier circuit in a second lateral direction perpendicular to the first lateral direction.

In some implementations, the Y-decoder circuit and one memory-group-driver circuit are arranged between the first word-line-driver circuit and the second word-line-driver circuit in the first lateral direction, and the first and second word-line-driver circuits, the one memory-group-driver circuit, and the Y-decoder circuit are arranged between a first portion of the sense amplifier circuit and a second portion of the sense amplifier circuit in a second lateral direction perpendicular to the first lateral direction.

In some implementations, the peripheral structure further comprises at least one X-decoder circuit coupled with the buffer circuit, wherein a first X-decoder circuit of the at least one X-decoder circuit is located on the peripheral structure, and vertically offset from a region of the memory array structure that is between two laterally adjacent memory banks.

In some implementations, each memory block comprises a plurality of memory cells each comprising at least one vertical transistor and at least one vertical capacitor.

Another aspect of the present disclosure provides a method of forming a memory device, comprising: forming a memory array structure comprising a plurality of memory banks, each of the memory banks comprising a plurality of memory groups, each memory group having at least one memory block; forming a peripheral structure, comprising forming a plurality of memory-group-driver circuits each corresponding to one of the plurality of memory groups, respectively; and bonding the memory array structure and the peripheral structure, such that each memory-group-driver circuit is coupled with word lines of the at least one memory block of a corresponding one of the plurality of memory groups, and overlaps with one of the at least one memory block in a vertical direction.

In some implementations, forming each memory-group-driver circuit comprises: forming a precharge-voltage-driver circuit configured to provide a precharge voltage to the word lines of the at least one memory block of the corresponding one of the plurality of memory groups.

In some implementations, forming each memory-group-driver circuit further comprises: forming a discharge-voltage-driver circuit configured to provide a discharge voltage to the word lines of the at least one memory block of the corresponding one of the plurality of memory groups.

In some implementations, forming one of the memory-group-driver circuits comprises: forming a buffer circuit configured to buffer control signals of the precharge-voltage-driver circuit or the discharge-voltage-driver circuit.

In some implementations, forming the peripheral structure further comprises: forming a plurality of memory-group-driver-interconnect lines configured to couple with a corresponding memory-group-driver circuit and one parity of word lines.

In some implementations, forming the memory array structure comprises arranging a subset of the plurality of memory groups in a row along a first lateral direction; and forming the peripheral structure further comprises arranging the memory-group-driver-interconnect lines coupled with the memory-group-driver circuits of the subset of the plurality of memory groups in a same subset of horizontal routing channels along the first lateral direction.

In some implementations, a number of the horizontal routing channels in the same subset of horizontal routing channels depends on a number of the word lines of each memory block, and is independent of a number of the memory groups in the subset of the plurality of memory groups.

In some implementations, forming the peripheral structure further comprises: forming a plurality of word-line-driver circuits, a plurality of Y-decoder circuits, and a plurality of sense amplifier circuits, wherein after bonding the memory array structure and the peripheral structure, the plurality of word-line-driver circuits are located between adjacent memory blocks, each Y-decoder circuit overlaps with a corresponding one memory block in the vertical direction, and each sense amplifier circuit at least partially overlaps with the corresponding one memory block in the vertical direction.

In some implementations, forming the peripheral structure further comprises: arranging at least one sense amplifier circuit of the plurality of sense amplifier circuits, a first Y-decoder circuit of the plurality of Y-decoder circuits, and one memory-group-driver circuit so as to be located between a first word-line-driver circuit and a second word-line-driver circuit in the first lateral direction; and arranging the one memory-group-driver circuit so as to be located between the at least one sense amplifier circuit and the first Y-decoder circuit in a second lateral direction perpendicular to the first lateral direction.

In some implementations, forming the peripheral structure further comprises: arranging at least one sense amplifier circuit of the plurality of sense amplifier circuits, a first Y-decoder circuit of the plurality of Y-decoder circuits, and one memory-group-driver circuit so as to be located between a first word-line-driver circuit and a second word-line-driver circuit in the first lateral direction; and arranging the one memory-group-driver circuit and the first Y-decoder circuit so as to be located between a first portion of the at least one sense amplifier circuit and a second portion of the at least one sense amplifier circuit in a second lateral direction perpendicular to the first lateral direction.

In some implementations, forming the peripheral structure further comprises: arranging a first Y-decoder circuit of the plurality of Y-decoder circuits and one memory-group-driver circuit so as to be located between a first word-line-driver circuit and a second word-line-driver circuit in the first lateral direction; and arranging the first and second word-line-driver circuits, the one memory-group-driver circuit, and the first Y-decoder circuit so as to be located between a first portion of the sense amplifier circuits and a second portion of the sense amplifier circuits in a second lateral direction perpendicular to the first lateral direction.

In some implementations, forming the peripheral structure further comprises: forming at least one X-decoder circuit coupled with the buffer circuit, wherein after bonding the memory array structure and the peripheral structure, a first X-decoder circuit of the at least one X-decoder circuit is located on the peripheral structure, and vertically offset from a region of the memory array structure that is between two laterally adjacent memory banks.

In some implementations, forming each memory block comprises: forming a plurality of memory cells each comprising at least one vertical transistor and at least one vertical capacitor.

Another aspect of the present disclosure provides a memory system, comprising: a memory device, comprising: a memory array structure comprising a plurality of memory banks, each of the memory banks comprising a plurality of memory groups, each memory group having at least one memory block, and a peripheral structure stacked with the memory array structure in a vertical direction, and comprising a plurality of memory-group-driver circuits each corresponding to one of the plurality of memory groups, respectively, wherein each memory-group-driver circuit is coupled with word lines of the at least one memory block of a corresponding one of the plurality of memory groups, and overlaps with one of the at least one memory blocks in the vertical direction; and a memory controller coupled with the memory device and configured to control the memory device.

Another aspect of the present disclosure provides a memory device, comprising: a memory array structure comprising memory banks, each of the memory banks comprising a memory block; and a peripheral structure stacked with the memory array structure in a vertical direction, and comprising: a discharge-voltage-driver circuit coupled with a word line of the memory block; and a precharge-voltage-driver circuit, wherein the precharge-voltage-driver circuit and the discharge-voltage-driver circuit each is coupled with a word-line-driver, wherein the precharge-voltage-driver circuit and the discharge-voltage-driver circuit overlap with the memory block in the vertical direction.

These illustrative implementations are mentioned not to limit or define the present disclosure, but to provide examples to aid understanding thereof. Additional implementations are discussed in the Detailed Description, and further description is provided there.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use implementations of the present disclosure.

FIGS. 17A-B are a flow diagram of a method of forming a peripheral structure for a memory device in accordance with this disclosure.

FIGS. 18A-B are a flow diagram of a method of forming an alternative peripheral structure for a memory device in accordance with this disclosure.

FIGS. 19A-B are a flow diagram of a method of forming another alternative peripheral structure for a memory device in accordance with this disclosure.

Figure 1A:
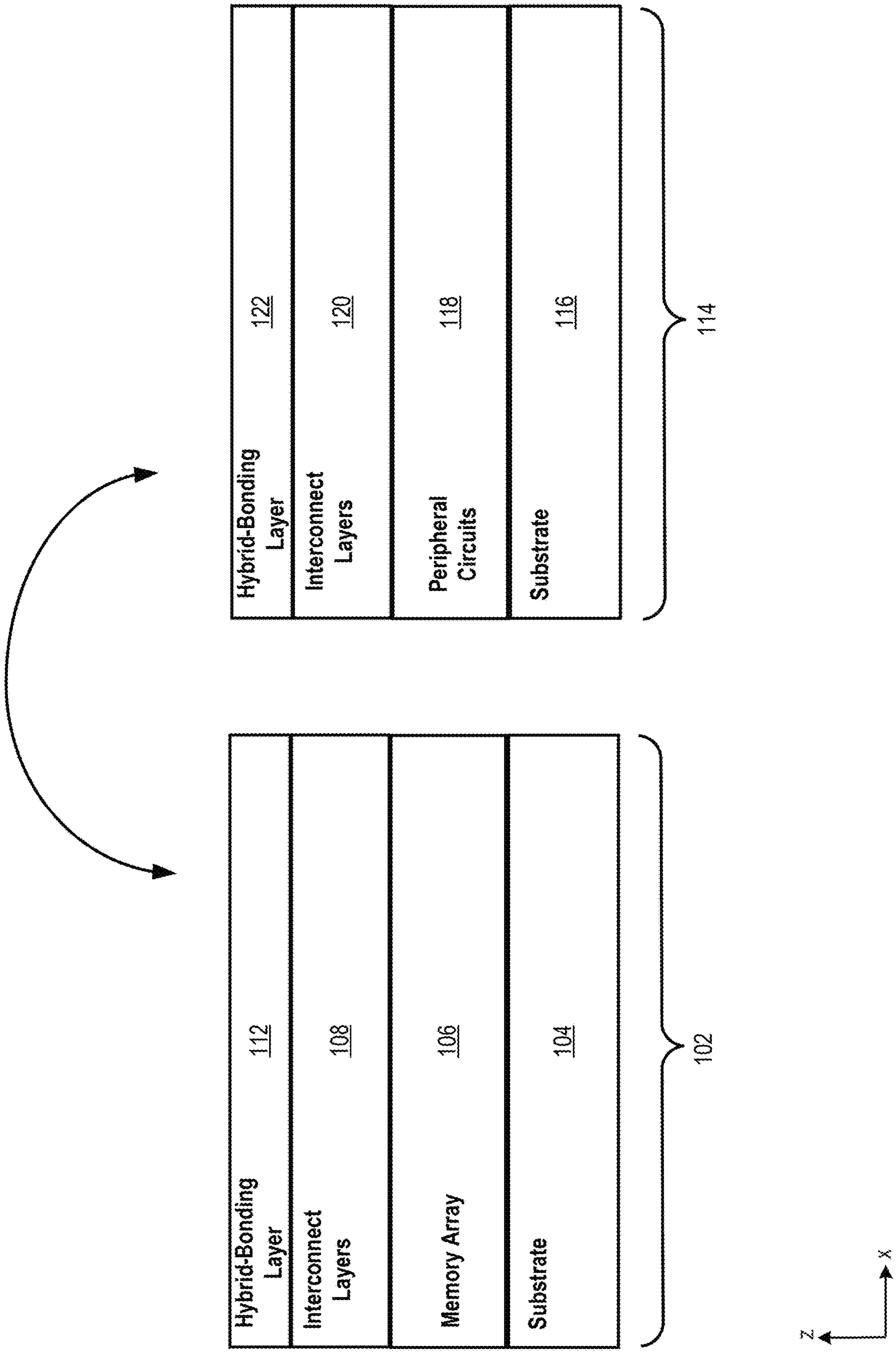
FIG. 1A is a block diagram illustrating a first semiconductor structure and a second semiconductor structure prior to being bonded together to form a 3D memory device.

The present disclosure will be described with reference to the accompanying drawings.

DETAILED DESCRIPTION

The market for semiconductor memory products is very competitive. The ability to reduce the cost of manufacturing a semiconductor memory product increases the profitability of the manufacturer. Moreover, the ability to manufacture a semiconductor memory product at a lower price than a competitor may allow the manufacturer to increase its market share.

One of the ways in which the cost of a semiconductor memory product may be reduced is by reducing the amount of area required to implement the semiconductor memory product. Various implementations in accordance with this disclosure may reduce the amount of area required to implement a semiconductor memory product by reducing the amount of routing required. That is, by reducing the number of interconnect lines it may be possible to achieve a more area-efficient layout, and thus reduce the amount of area required. In connection with semiconductor memory products, reducing the number of interconnect lines over the memory cells in a memory array may provide the area-efficient layout needed to reduce the amount of area required to implement the semiconductor memory product.

Many types of memory devices, such as semiconductor memory devices for example, use a physical arrangement that includes word lines and bit lines. The word lines and bit lines are coupled to an array of memory cells, referred to herein as a memory array. Additionally, the word lines and bit lines are coupled to circuitry outside of the memory array. For example, a bit line may be connected to a sense amplifier, and a word line may be connected to a word-line-driver, and the sense amplifier circuitry and the word-line-driver circuitry may be located outside the memory array by being separated therefrom laterally or vertically.

Various illustrative examples and implementations are presented herein to facilitate the understanding of the structures of, and methods for producing, a memory device, such as a semiconductor memory product, with an area-efficient layout that results in a smaller area requirement, and therefore a smaller, higher-yielding, chip.

It is noted that references in the specification to "one implementation," "an implementation," "an example implementation," "some implementation," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. Terms used herein to describe various shapes, sizes, distances, or directions that are subject to manufacturing tolerances should be understood to be nominal unless specifically stated otherwise.

As used herein, the term "vertical/vertically" means nominally orthogonal to the lateral surface of the laterally-oriented substrate.

As used herein, the acronym "CMOS" refers to Complementary Metal Oxide Semiconductor. "CMOS process" refers to a semiconductor manufacturing process that produces both n-channel field effect transistors and p-channel field effect transistors on the same substrate. "CMOS circuit" refers to an electrical circuit that includes both an n-channel field effect transistor and a p-channel field effect transistor.

Various implementations in accordance with this disclosure use a memory array formed on a first wafer and a peripheral structure formed on a second wafer. The peripheral structure, which contains circuits and interconnects is bonded together with the memory array in a face-face configuration. FIGS. 1A-1F illustrate a semiconductor memory having a memory array and a peripheral structure, unbonded, bonded, and in different orientations.

FIG. 1A is a block diagram illustrating a pair of semiconductor structures including a first semiconductor structure 102 (also referred to herein as memory array structure 102) and a second semiconductor structure 114 (also referred to herein as peripheral structure 114) prior to being bonded together to form a memory device, such as, but not limited to a dynamic random-access memory (DRAM). First semiconductor structure 102 and second semiconductor structure 114 may be formed on different wafers. First semiconductor structure 102 may be a die separated from a wafer, and second semiconductor structure 114 may be a die separated from a wafer.

Referring to FIG. 1A, first semiconductor structure 102 includes a substrate 104, a memory array 106, interconnect layers 108 disposed above memory array 106, and a hybrid-bonding layer 112 disposed above interconnect layers 108. In some implementations, substrate 104 may be, but is not limited to, a silicon substrate, and memory array 106 may be, but is not limited to, a DRAM array. It is noted that in some, but not all, instances, substrate 104 may be thinned or removed. Interconnect layer 108 may include multiple levels of interconnect lines, and each level may be electrically connected to a vertically adjacent level by one or more vias. Hybrid-bonding layer 112 may be a dielectric layer having a plurality of first bonding contacts disposed therein.

Still referring to FIG. 1A, second semiconductor structure 114 includes a substrate 116, peripheral circuits 118, interconnect layers 120 disposed above peripheral circuits 118, and a hybrid-bonding layer 122 disposed above interconnect layers 120. In some implementations, peripheral circuits 118 may be, but are not limited to, CMOS circuits. Interconnect layer 120 may include multiple levels of interconnect lines, and each level may be electrically connected to a vertically adjacent level by one or more vias. Hybrid-bonding layer 122 may be a dielectric layer having a plurality of second bonding contacts disposed therein. First semiconductor structure 102 and second semiconductor structure 114 are configured to be bonded together in a face-to-face orientation such that hybrid-bonding layer 122 and hybrid-bonding layer 112 are bonded to each other, and at least a portion of the first bonding contacts make electrical contact with a least a portion of the second bonding contacts.

Figure 1B:
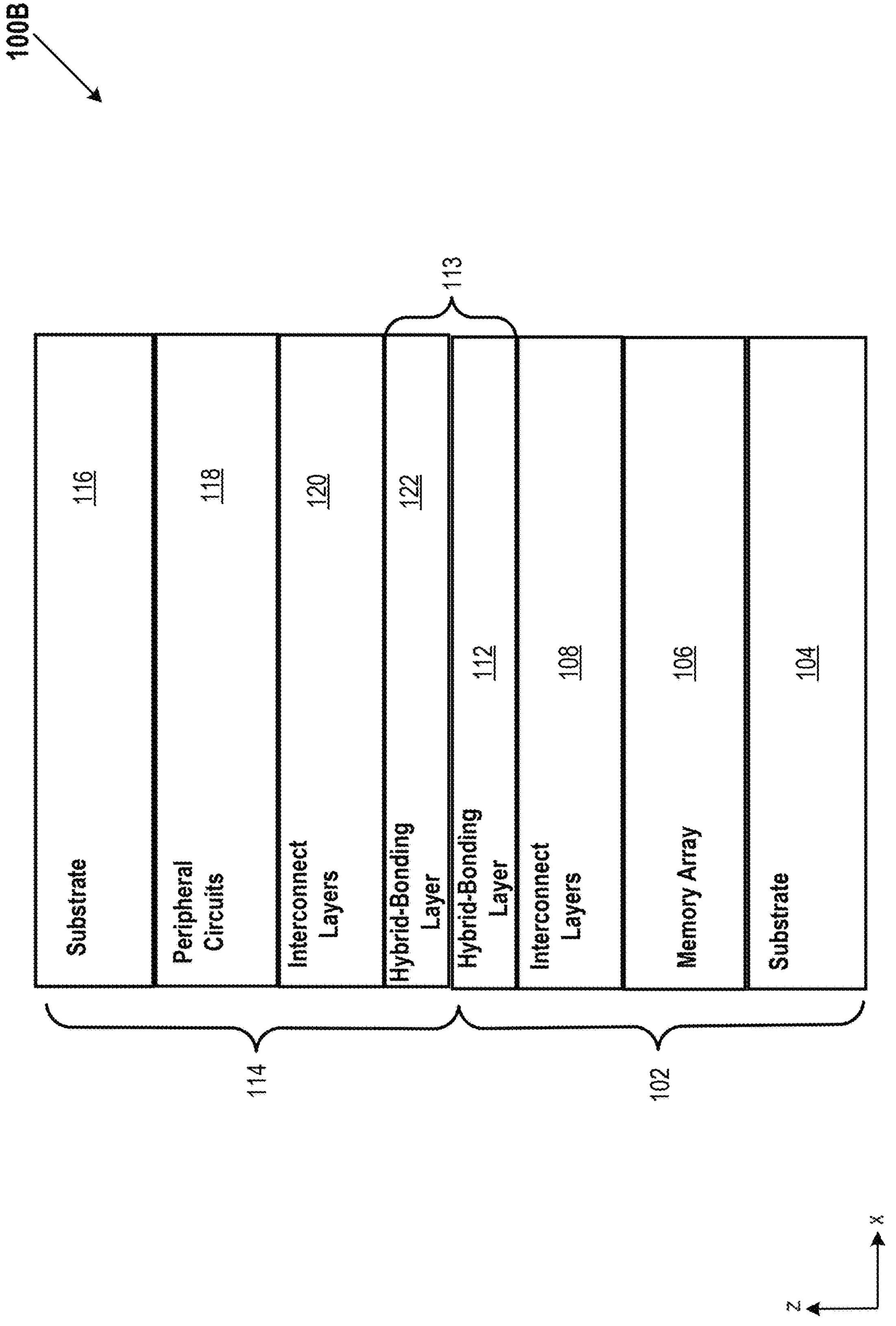
FIG. 1B is a block diagram illustrating the first semiconductor structure and the second semiconductor structure after being bonded together in a face-to-face orientation to form a 3D memory device.

FIG. 1B is a block diagram showing first semiconductor structure 102 and second semiconductor structure 114 after being hybrid-bonded together in a face-to-face orientation to form a semiconductor memory device 100B. In this bonded configuration, one or more first bonding contacts of hybrid-bonding layer 112 are in electrical contact with a corresponding one or more second bonding contacts of hybrid-bonding layer 122. Note that in the bonded configuration, hybrid-bonding layer 112 and hybrid-bonding layer 122 may be referred to herein as hybrid-bonding interface 113.

Still referring to FIG. 1B, it will be appreciated that the orientation of semiconductor memory device 100B, with first semiconductor structure 102 on the bottom and second semiconductor structure 114 on top is illustrative and not limiting. That is, semiconductor memory device 100B, may be oriented such that second semiconductor structure 114 is on the bottom with its hybrid-bonding layer 122 as its top layer, and first semiconductor structure 102 is on top with its hybrid-bonding layer 112 as its bottom layer. In this alternative orientation, memory array 106 is in the top portion of semiconductor memory device 100B. In various manufacturing processes after first semiconductor structure 102 and second semiconductor structure 114 are bonded together, a substrate 104/116 may be partially or completely removed from at least one of the semiconductor structures, and a new semiconductor layer formed thereon. Additional details of the first and second bonding contacts are described below in connection with FIGS. 1C and 1D.

Figure 1C:
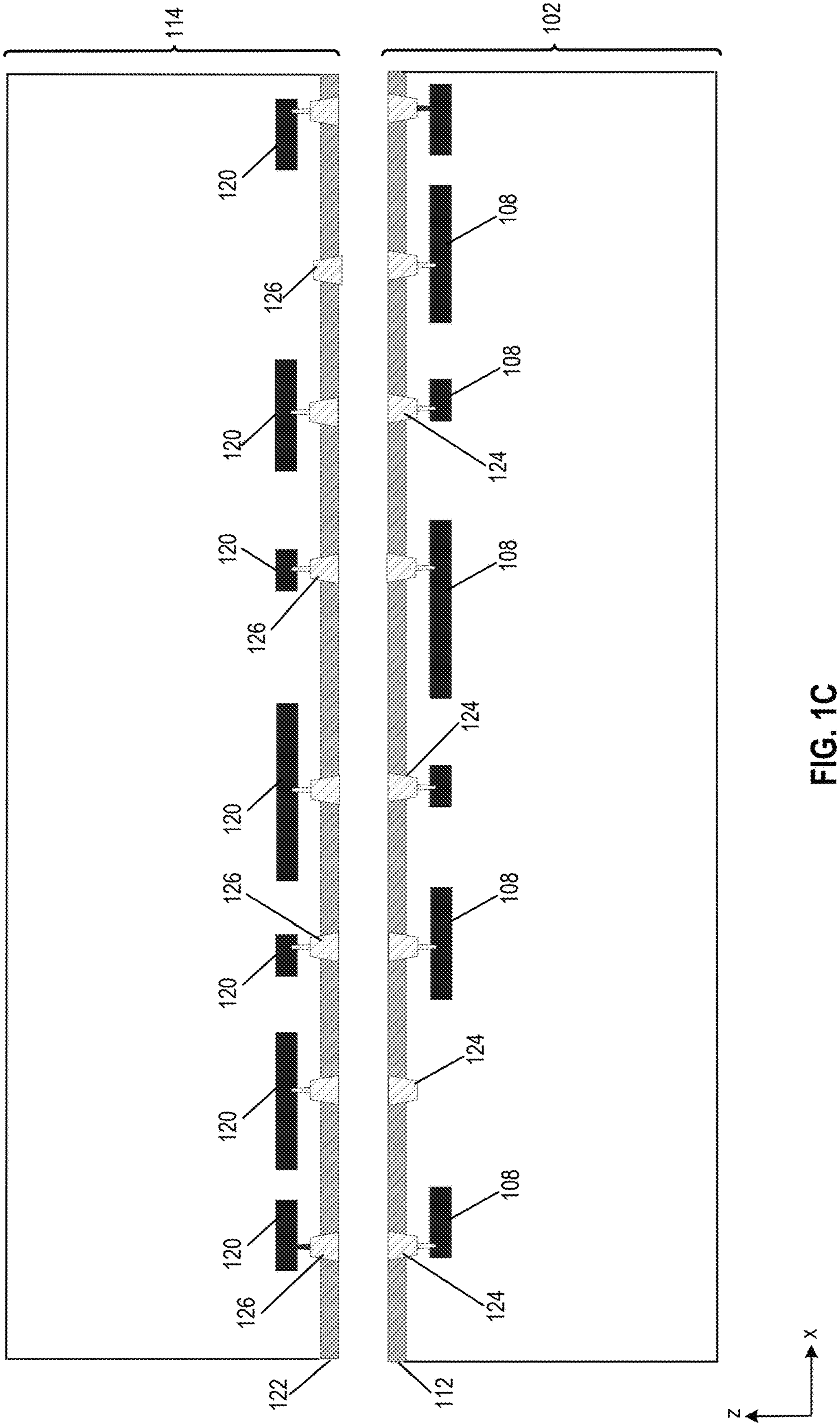
FIG. 1C illustrates a bonding layer of the first semiconductor structure, and a bonding layer of the second semiconductor structure, aligned for, but prior to, bonding in a face-to-face orientation to form a 3D memory device.

FIG. 1C illustrates first semiconductor structure 102 with a more detailed representation of hybrid-bonding layer 112, and second semiconductor structure 114 with a more detailed representation of hybrid-bonding layer 122, aligned for, but prior to, bonding in a face-to-face orientation to form a semiconductor memory device. As shown in FIG. 1C, hybrid-bonding layer 112 includes a plurality of first bonding contacts 124 disposed therein. Interconnect lines from interconnect layer 108 are also illustrated. In this illustrative implementation, one or more first bonding contacts 124 may be in electrical contact with an interconnect line of interconnect layer 108. Interconnect lines from interconnect layer 108 provide electrical pathways from at least memory array 106 of first semiconductor structure 102 to one or more first bonding contacts 124.

Still referring to FIG. 1C, hybrid-bonding layer 122 of second semiconductor structure 114 includes a plurality of second bonding contacts 126 disposed therein. Second semiconductor structure 114 further includes interconnect lines from interconnect layer 120. In this illustrative implementation, one or more second bonding contacts 126 may be in electrical contact with an interconnect line of interconnect layer 120. Interconnect lines from interconnect layer 120 provide electrical pathways from at least peripheral circuits 118 of second semiconductor structure 114 to one or more second bonding contacts 126.

Figure 1D:
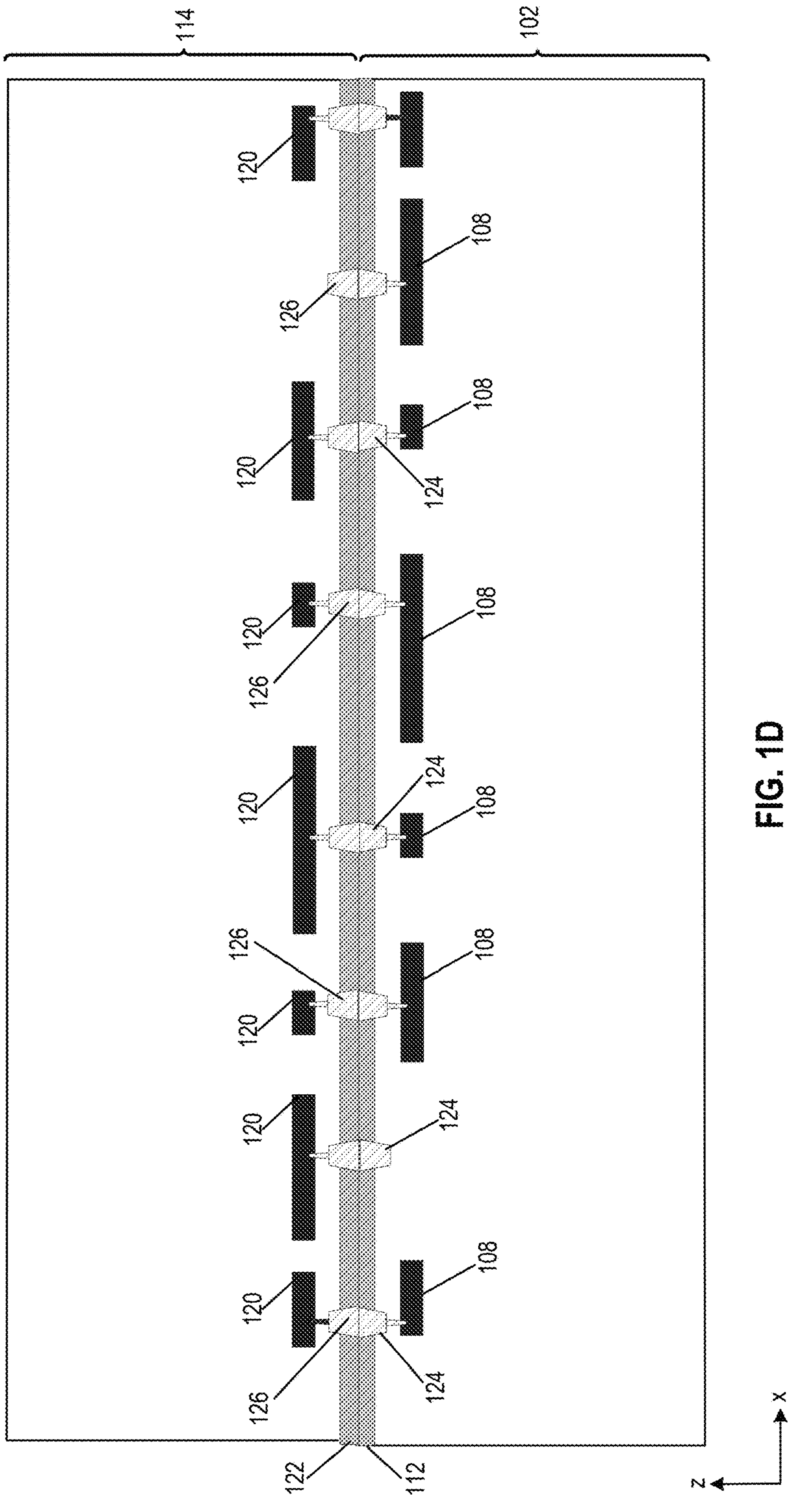
FIG. 1D illustrates the bonding layer of the first semiconductor structure, and the bonding layer of the second semiconductor structure, after bonding in a face-to-face orientation to form a 3D memory device.

FIG. 1D is similar to FIG. 1C but illustrates hybrid-bonding layer 112 of first semiconductor structure 102, and hybrid-bonding layer 122 of second semiconductor structure 114, after bonding in a face-to-face orientation to form a semiconductor memory device. In this way, first bonding contacts 124 may be in electrical contact with the corresponding ones of second bonding contacts 126. The electrical connections between first bonding contacts 124 and second bonding contacts 126 allow electrical signals to pass between first semiconductor structure 102 and second semiconductor structure 114.

Figure 1E:
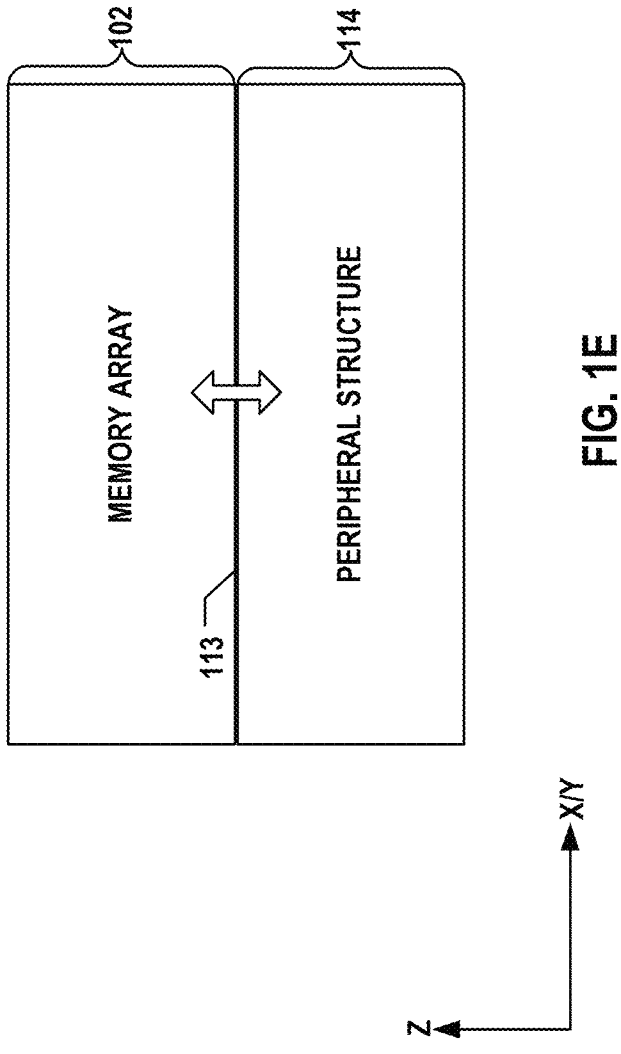
FIG. 1E is a schematic diagram of a portion of a memory array structure and a portion of a peripheral structure with the memory array structure illustrated as being above the peripheral structure.

FIG. 1E is a block diagram of a bonded semiconductor structure 100 including a portion of a memory array structure 102 and a portion of a peripheral structure 114 with the memory array structure 102 illustrated as being above the peripheral structure 114.

Figure 1F:
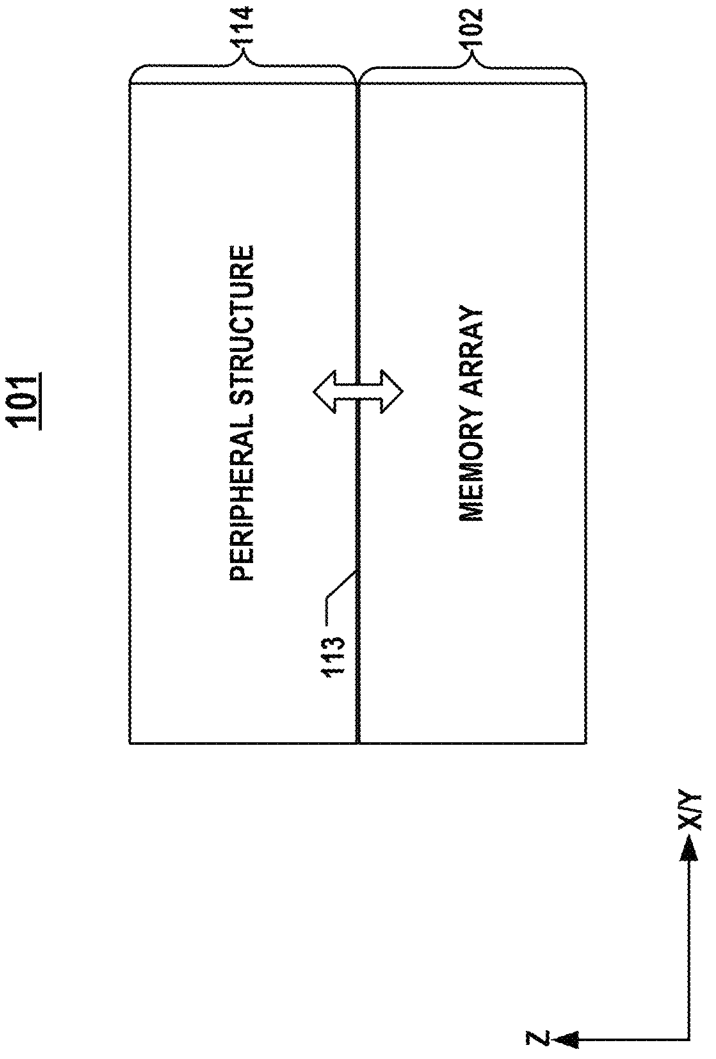
FIG. 1F is a schematic diagram of a portion of a memory array structure and a portion of a peripheral structure with the memory array structure illustrated as being beneath the peripheral structure.

FIG. 1F is a block diagram of a bonded semiconductor structure 101 including a portion of a memory array structure 102 and a portion of a peripheral structure 114 with the memory array structure 102 illustrated as being beneath the peripheral structure 114.

Figure 2:
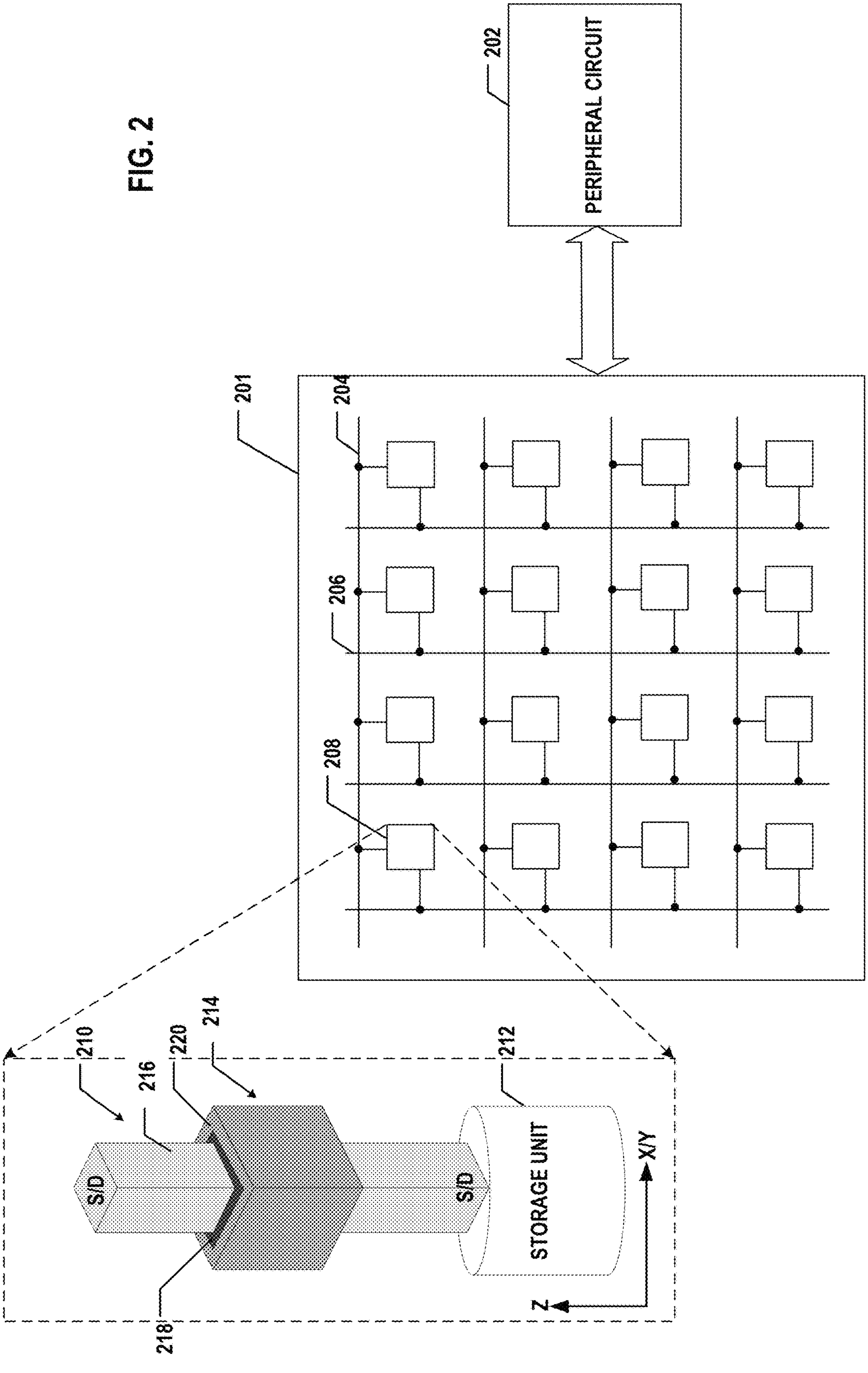
FIG. 2 is a high-level block diagram of a memory array structure including an illustrative memory cell having a vertically-oriented transistor.

FIG. 2 is a block diagram of a memory array 201 coupled to peripheral circuits of a peripheral structure 202, and further shows an expanded structural view of a memory cell. Memory array 201 includes a plurality of word lines 204, a plurality of bit lines 206, and a plurality memory cells 208. Each memory cell 208 is coupled to one bit line and one word line as shown in the figure.

Still referring to FIG. 2, a structural view 210 of memory cell 208 is shown. A storage unit 212, typically implemented as a capacitor, is connected to a first source/drain (S/D) terminal of a FET 214. FET 214 includes a vertically-oriented pillar of semiconductor material 216, a gate dielectric 218 disposed around a portion of semiconductor material 216, and a gate electrode 220 disposed on gate dielectric 218. FET 214 may be referred to herein as a vertical transistor.

Figure 3:
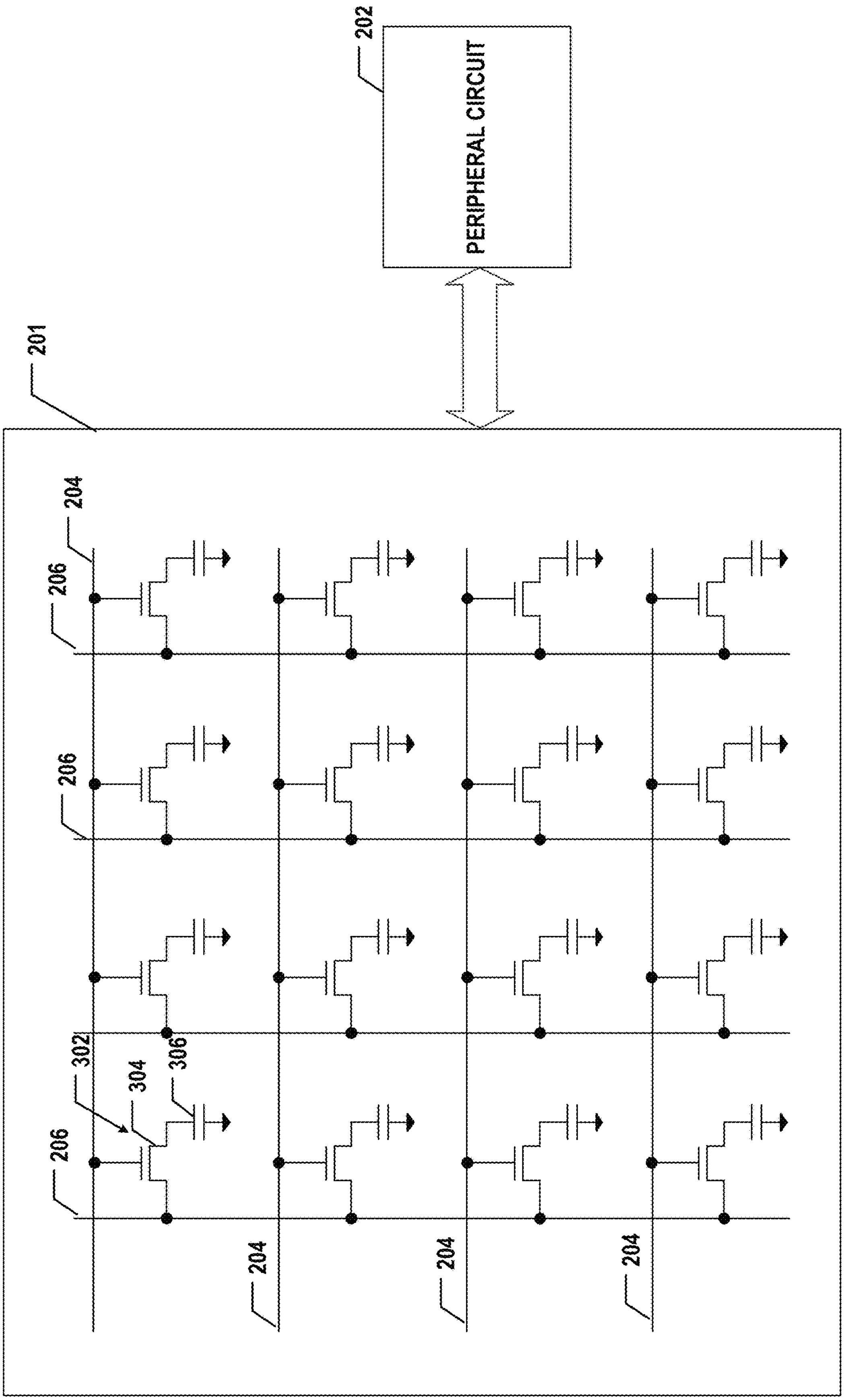
FIG. 3 is a schematic diagram of an illustrative dynamic random-access memory (DRAM) array.

FIG. 3 is a schematic diagram of an illustrative memory array 201 of dynamic memory cells, and further shows that the memory array coupled to peripheral circuits of a peripheral structure 202. Each dynamic memory cell 302 in array 201 includes a field effect transistor (FET) 304 and a capacitor 306. In the illustrative implementation of FIG. 3, FET 304 is an n-channel FET. Dynamic memory cells 302 are arranged in rows and columns to form a two-dimensional array, i.e., memory array 201. In the example of FIG. 3, memory array 201 has four rows and four columns. Thus, the four-by-four arrangement of illustrative memory array 201 provides sixteen dynamic memory cells 302. Various arrays, in accordance with this disclosure, may be made in any combination of rows and columns, and the illustrative four-by-four array shown in FIG. 3, is not a limitation on the size of memory array 201 in accordance with this disclosure.

Still referring to FIG. 3, a gate terminal of FET 304 is coupled to a word line 204, a first source/drain (S/D) terminal of FET 304 is coupled to a bit line 206, a second S/D terminal of FET 304 is coupled to a first terminal of capacitor 306, and a second terminal of capacitor 306 is coupled to a ground node. This arrangement is sometimes referred to as a "1T1C" memory cell, also known as a one-transistor, one-capacitor memory cell. In a 1T1C memory cell, there is one transistor and one capacitor per memory cell. The transistor acts as the access device, controlling the flow of charge to and from the capacitor. The capacitor is used to store and hold the charge, representing the data stored in the memory cell. The basic operation of a 1T1C memory cell involves two main states, i.e., the charged state and the discharged state. The charged state may represent a "1" bit, and the discharged state may represent a "0" bit. During a write operation, FET 304 is used to couple capacitor 306 to a voltage source or ground via bit line 206, allowing charge to be transferred onto or discharged from capacitor 306. This write operation modifies the charge stored in the capacitor, thereby storing the desired data. During a read operation, FET 304 is used to couple capacitor 306 to a sense amplifier (not shown) via bit line 206, which detects and amplifies the charge stored in the capacitor. The amplified signal is then interpreted as the stored data.

It will be appreciated by those skilled in the art that alternative dynamic memory cell circuit arrangements are possible, and implementations in accordance with this disclosure are not limited to 1T1C memory cells.

Figure 4:
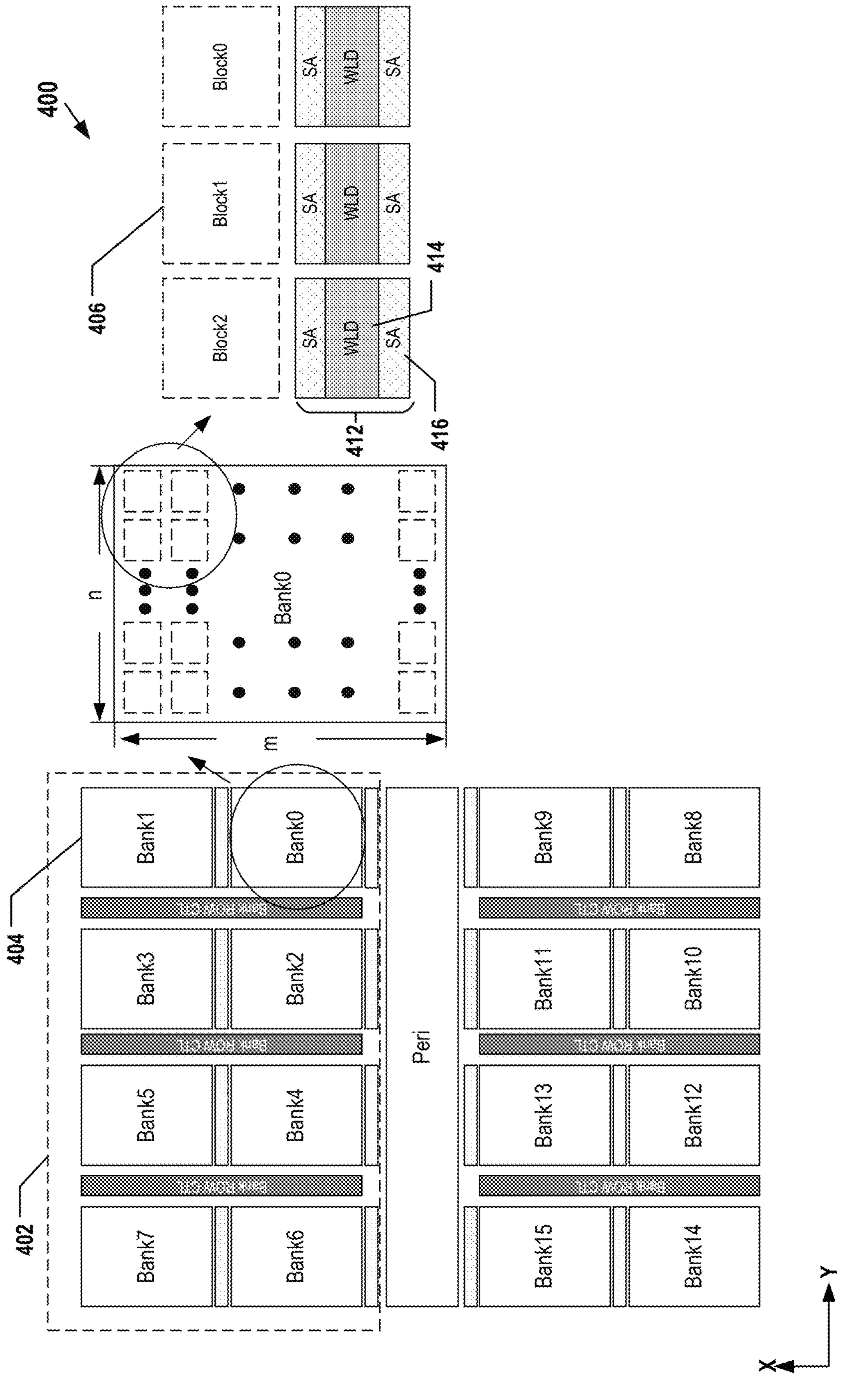
FIG. 4 illustrates a schematic view of a plan view of a memory device, in accordance with this disclosure.

FIG. 4 illustrates a schematic view of a plan view of a memory device 400, according to some aspects of the present disclosure. As shown in FIG. 4, memory device 400 may include one or more than one memory array structure 402, e.g., memory die. Each memory array structure 402 may include a plurality of memory banks 404. For example, as shown in FIG. 4, memory array structure 402 may include eight memory banks 404. Each memory bank 404 may include a plurality of memory blocks 406. For example, as shown in FIG. 4, memory bank 404 may include (m×n) memory blocks 406.

In some implementations, memory device 400 may further include a plurality of peripheral structures 412. In some implementations, each peripheral structure 412 may include at least one word line driver circuit (WLD circuit) 414 and at least one sense amplifier circuit (SA circuit) 416. In some implementations, as shown in FIG. 4, peripheral structure 412 may include one WLD circuit 414 and two SA circuits 416. It is noted that, in FIG. 4, memory block 406 and peripheral structure 412 are illustrated side-by-side to explain the size of the area covered by memory block 406 and peripheral structure 412. However, in the actual structure, in the plan view of memory device 400, memory block 406 and peripheral structure 412 may at least partially overlap each other. In some implementations, memory block 406 and peripheral structure 412 are individually formed on two different wafers or substrates and are bonded to each other with the at least a partially overlapping relationship. In some implementations, memory block 406 and peripheral structure 412 may fully overlap with each other.

In some implementations, peripheral structure 412 is formed on a first wafer and one peripheral structure 412 occupies a first area on the first wafer in a plan view of the first wafer. In some implementations, memory blocks 406 are formed on a second wafer and one memory block 406 occupies a second area on the second wafer in a plan view of the second wafer. After bonding the first wafer with the second wafer, the first area including WLD circuit 414 and SA circuit 416 at least partially overlaps the second area including memory block 406 in a plan view of memory device 400. In some implementations, the first area may include a first subarea having one WLD circuit 414 and two second subareas each having one SA circuit 416. In some implementations, the two second subareas may be disposed on two sides of the first subarea. In other words, two SA circuits 416 may be disposed on two sides of one WLD circuit 414, as shown in FIG. 4.

In some implementations, when one memory block 406 includes M word lines and N bit lines, WLD circuit 414 may be used to control M word lines in the corresponding memory block 406, and each SA circuit 416 disposed on one side of WLD circuit 414 may be used to control N/2 bit lines in the corresponding memory block 406. In some implementations, SA circuit 416 may be shared by two adjacent memory blocks 406, and one SA circuit 416 may be used to control odd or even bit lines in two adjacent memory blocks 406.

Figure 5:
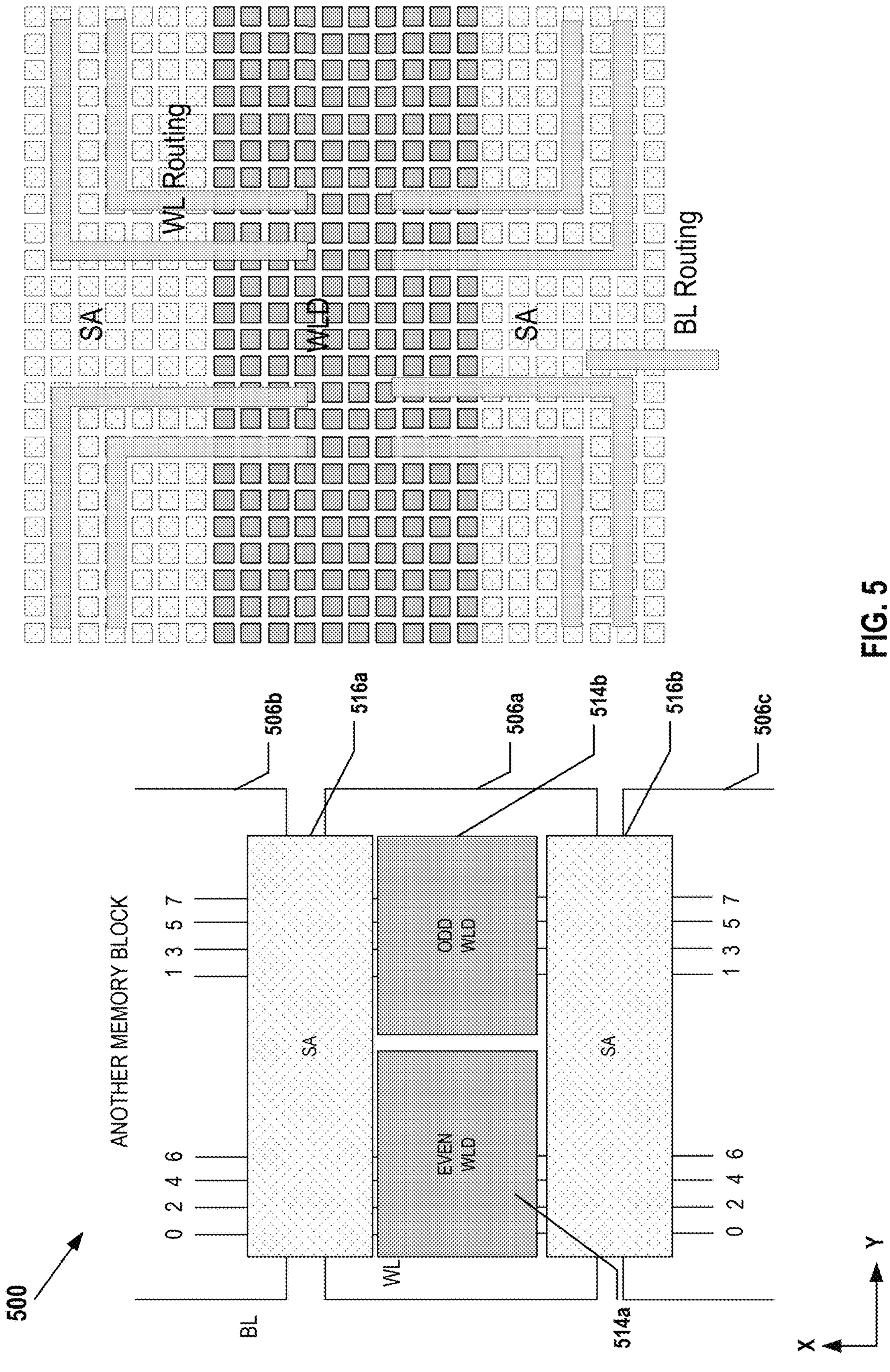
FIG. 5 illustrates a schematic view of an arrangement of a memory device, in accordance with this disclosure.

FIG. 5 illustrates a schematic view of an arrangement of memory device 500, in accordance with this disclosure. As shown in FIG. 5, an SA circuit includes an SA circuit 516*a* and an SA circuit 516*b*. SA circuit 516*a* may be used to control even bit lines in memory block 506*a* and memory block 506*b*. As shown in FIG. 5, SA circuit 516*a* includes two outputs: one output is connected to the even bit lines of memory block 506*a*, and the other output is connected to the even bit lines of memory block 506*b* above and adjacent to memory block 506*a* in the X-direction. Similarly, in some implementations, SA circuit 516*b* includes two outputs: one output is connected to the odd bit lines of memory block 506*a*, and the other output is connected to the odd bit lines of memory block 506*c* below and adjacent to memory block 506*a* in the X-direction.

In some implementations, a WLD circuit may further include a WLD circuit 514*a* and a WLD circuit 514*b*. In some implementations, WLD circuit 514*a* may be used to control the even word lines in memory block 506*a*, and WLD circuit 514*b* may be used to control the odd word lines in memory block 506*a*. In some implementations, WLD circuit 514*a* may be shared by memory block 506*a* and an adjacent memory block (not shown) disposed on the left side of memory block 506*a*, and WLD circuit 514*b* may be shared by memory block 506*a* and another adjacent memory block (not shown) disposed on the right side of memory block 506*a*. In some implementations, WLD circuit 514*a* may be used to control the even word lines in memory block 506*a* and the even word lines in the adjacent memory block, and WLD circuit 514*b* may be used to control the odd word lines in memory block 506*a* and the odd word lines in another adjacent memory block.

In other words, the SA circuit, including SA circuits 516*a* and 516*b*, and the WLD circuit, including WLD circuits 514*a* and 514*b*, may be disposed at least partially overlapping memory block 506*a*, or fully overlapping memory block 506*a*. Furthermore, the SA circuit and the WLD circuit may control memory block 506*a* alone, or may control memory block 506*a* and an adjacent memory block in the X-direction and/or the Y-direction together.

FIG. 5 further illustrates a schematic view of a word line routing and a bit line routing. As shown in FIG. 5, the word line routing may include both the horizontal direction (the Y-direction in FIG. 5) and the vertical direction (the X-direction in FIG. 5), and the bit line routing may include merely the vertical direction. In some implementations, the even word lines (e.g., WL 0, WL 2, WL 4, WL 6) can be connected to even WLD circuit 514*a*, and the odd word lines (e.g., WL 1, WL 3, WL 5, WL 7) can be connected to odd WLD circuit 514*b*.

Figure 6:
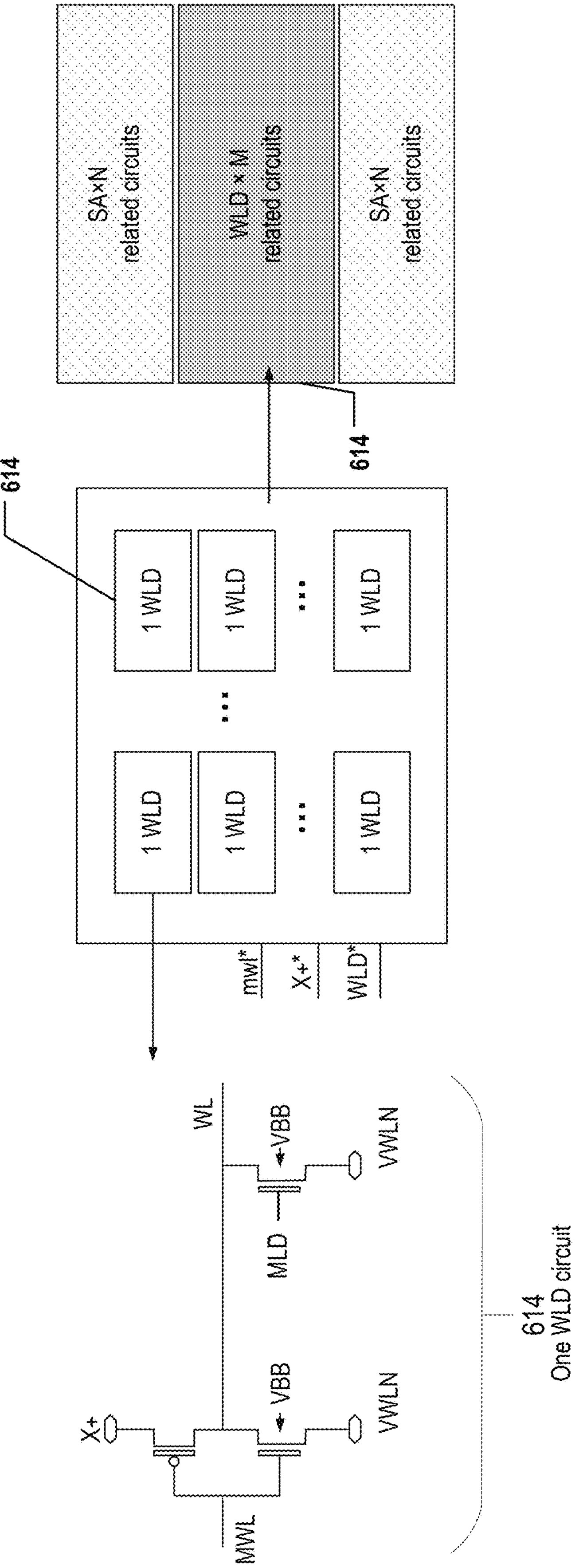
FIG. 6 illustrates a schematic view of a word line driver circuit of a memory device, in accordance with this disclosure.

FIG. 6 illustrates a schematic view of a WLD circuit 614, according to some aspects of the present disclosure. It is understood that WLD circuit 614 shown in FIG. 6 is for illustration only, and other designs or structures of WLD circuit 614 may also be applied to the current application. WLD circuit 614 in this example is a CMOS circuit having an input terminal configured to receive a signal labelled MWL, and an output terminal configured to provide an output signal labelled WL. WLD circuit 614 is coupled to a first voltage supply node labelled X+, and is further coupled to a second voltage supply node labelled VWLN. In this example, the voltage at first voltage supply node X+ is positive with respect to the voltage at second voltage supply node VWLN.

Still referring to FIG. 6, a plurality of WLD circuits 614 may be used for the word-lines of one or more memory blocks. In the illustrated implementation of FIG. 6, the plurality of WLD circuits 614 may be arranged such that they are disposed between a first group of sense amplifier (SA) circuits and a second group of SA circuits.

Figure 7:
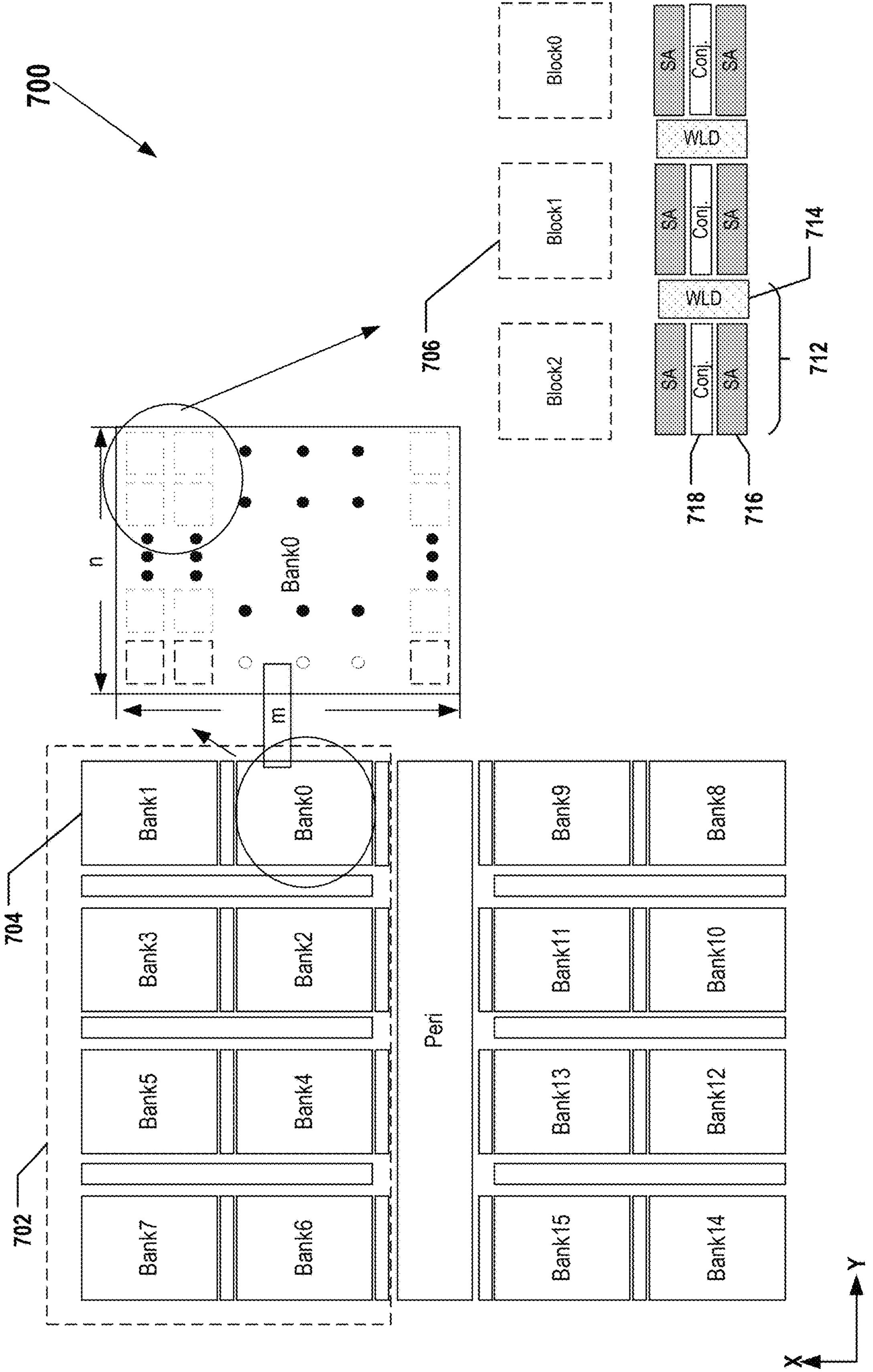
FIG. 7 illustrates a schematic view of a plan view of a memory device, in accordance with this disclosure.

FIG. 7 illustrates a schematic view of a plan view of a memory device 700, according to some aspects of the present disclosure. As shown in FIG. 7, memory device 700 may include one or more than one memory array structure 702, e.g., memory die. Each memory array structure 702 may include a plurality of memory banks 704. For example, as shown in FIG. 7, memory array structure 702 may include eight memory banks 704. Each memory bank 704 may include a plurality of memory blocks 706. For example, as shown in FIG. 7, memory bank 704 may include (m×n) memory blocks 706.

In some implementations, memory device 700 may further include a plurality of peripheral structures 712. In some implementations, each peripheral structure 712 may include at least one word line driver circuit (WLD circuit) 714 and at least one sense amplifier circuit (SA circuit) 716. In some implementations, as shown in FIG. 7, peripheral structure 712 may include one WLD circuit 714 and two SA circuits 716. In some implementations, peripheral structure 712 may include an area 718 in which circuitry, such as but not limited to, voltage-generation circuitry may be disposed.

It is noted that, in FIG. 7, memory block 706 and peripheral structure 712 are illustrated side-by-side to explain the size of the area covered by memory block 706 and peripheral structure 712. However, in the actual application and actual structure, in the plan view of memory device 700, memory block 706 and peripheral structure 712 may at least partially overlap each other. In some implementations, memory block 706 and peripheral structure 712 are individually formed on two different wafers or substrates and are bonded to each other with the at least partially overlapping relationship.

In some implementations, peripheral structure 712 is formed on a first wafer, and one peripheral structure 712 occupies a first area on the first wafer in a plan view of the first wafer. In some implementations, memory blocks 706 are formed on a second wafer, and one memory block 706 occupies a second area on the second wafer in a plan view of the second wafer. After bonding the first wafer with the second wafer, the first area including WLD circuit 714 and SA circuits 716 at least partially overlaps the second area including memory block 706 in a plan view of memory device 700, that is, the overlap of the first area and the second area is in the vertical direction. In some implementations, the first area may include one first subarea having one WLD circuit 714 and two second subareas each having one SA circuit 716. In some implementations, the first subarea having one WLD circuit 714 may be located between two adjacent memory blocks 706 when viewed with the peripheral circuit stacked in the vertical direction with the memory blocks. In some implementations, the second subareas each having one SA circuit 716 may at least partially overlap with the second area having memory block 706 when viewed with the peripheral circuit stacked in the vertical direction with the memory blocks. In some implementations, the second subareas may fully overlap with the second area having memory block 706. In some implementations, SA circuit 716 may be shared by two adjacent memory blocks 706, and one SA circuit 716 may be used to control odd or even bit lines in two adjacent memory blocks 706. For example, SA circuit 716 may include two outputs: one output is connected to the even bit lines of memory block 706, and the other output is connected to the even bit lines of a memory block adjacent to memory block 706 in the X-direction of FIG. 7. It is noted that in some implementations, peripheral structure 712 includes an area 718 in which additional circuitry may be disposed.

In some implementations, WLD circuit 714 is located on a peripheral wafer, e.g., a CMOS wafer, corresponding to the position between two memory blocks 706 on a memory array wafer in a plan view (i.e., perpendicular to the stacking direction of the memory array structure and the peripheral structure). In some implementations, WLD circuit 714 provides corresponding signals to the odd word lines or the even word lines of two adjacent memory blocks 706. For example, WLD circuit 714 may provide corresponding signals to the odd word lines of two adjacent memory blocks 706.

Figure 8:
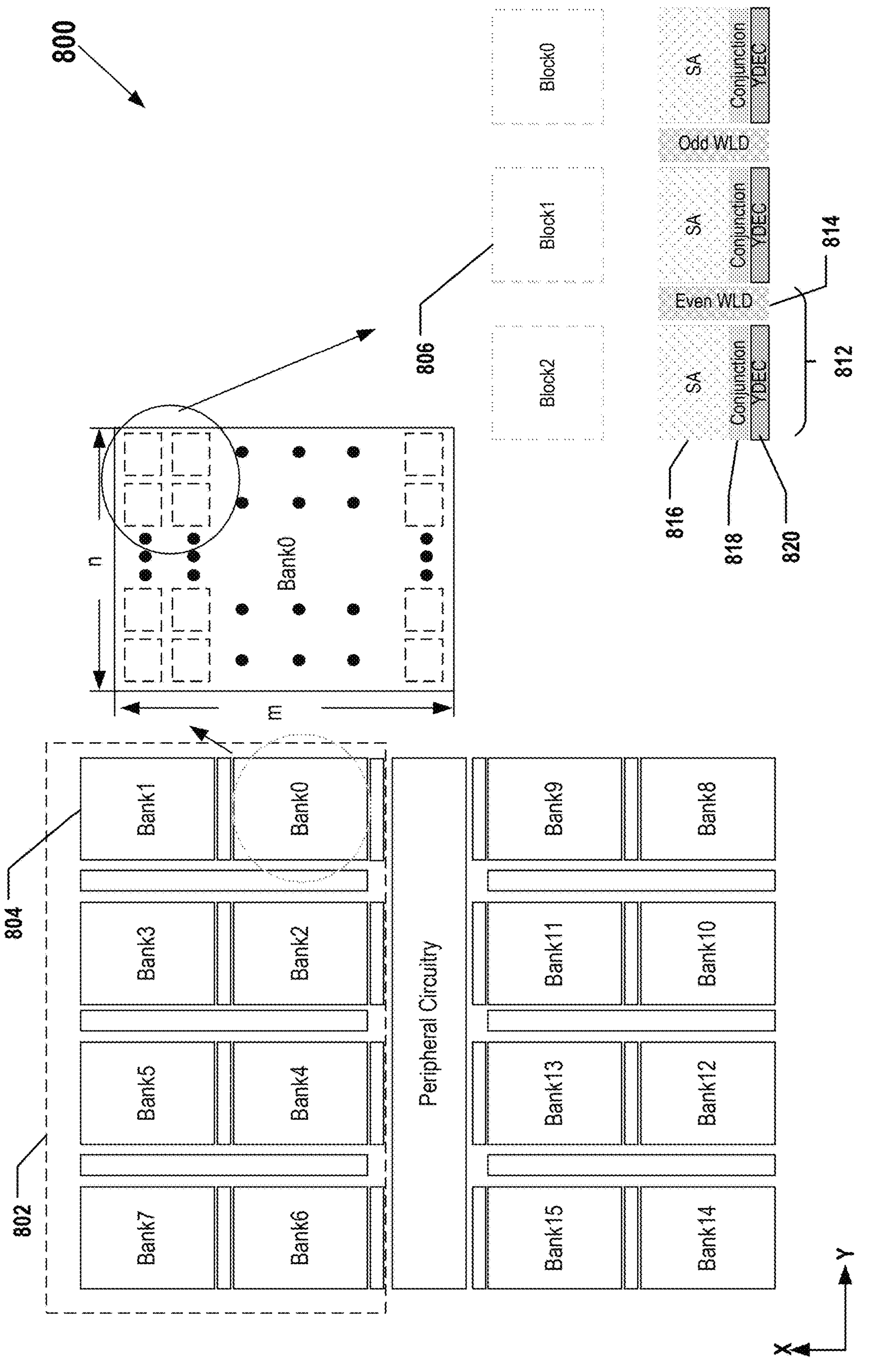
FIG. 8 illustrates a schematic view of a plan view of a memory device, in accordance with this disclosure.

FIG. 8 illustrates a schematic view of a plan view of a memory device 800, according to some aspects of the present disclosure. As shown in FIG. 8, memory device 800 may include one or more than one memory array structure 802, e.g., a memory die. Each memory array structure 802 may include a plurality of memory banks 804. For example, as shown in FIG. 8, memory array structure 802 may include eight memory banks 804. Each memory bank 804 may include a plurality of memory blocks 806. For example, as shown in FIG. 8, memory bank 804 may include (m×n) memory blocks 806.

In some implementations, memory device 800 may further include a plurality of peripheral structures 812. In some implementations, each peripheral structure 812 may include at least one word line driver circuit (WLD circuit) 814 and at least one sense amplifier circuit (SA circuit) 816. In some implementations, as shown in FIG. 8, peripheral structure 812 may include one WLD circuits 814 and one SA circuit 816. It is noted that, in FIG. 8, memory block 806 and peripheral structure 812 are illustrated side-by-side to explain the size of the area covered by memory block 806 and peripheral structure 812. However, in the actual application and actual structure, in the plan view of memory device 800, memory block 806 and peripheral structure 812 may at least partially overlap with each other. In some implementations, memory block 806 and peripheral structure 812 are individually formed on two different wafers or substrates and are bonded to each other with at least a partially overlapping relationship. It is noted that in some implementations, peripheral structure 812 includes an area 818 in which additional circuitry may be disposed. It is further noted that peripheral structure 812 may include circuitry for a Y-decoder 820.

In some implementations, peripheral structure 812 is formed on a first wafer, and one peripheral structure 812 occupies a first area on the first wafer in a plan view of the first wafer. In some implementations, memory blocks 806 are formed on a second wafer, and one memory block 806 occupies a second area on the second wafer in a plan view of the second wafer. After bonding the first wafer with the second wafer, the first area including WLD circuit 814 and SA circuits 816 at least partially overlaps the second area including memory block 806 in a plan view of memory device 800, that is, the overlap of the first area and the second area is in the vertical direction. In some implementations, the first area may include one first subarea having one WLD circuit 814 and one second subarea each having one SA circuit 816. In some implementations, the first subarea having one WLD circuit 814 may be located between two adjacent memory blocks 806, when viewed with the peripheral circuit stacked in the vertical direction with the memory blocks. In some implementations, the first subarea may not overlap with the second area having memory block 806. In some implementations, the second subarea having one SA circuit 816 may at least partially overlap the second area having a memory block 806, when viewed with the peripheral circuit stacked in the vertical direction with the memory blocks. In some implementations, the second subarea may fully overlap the second area having memory block 806.

Figure 9:
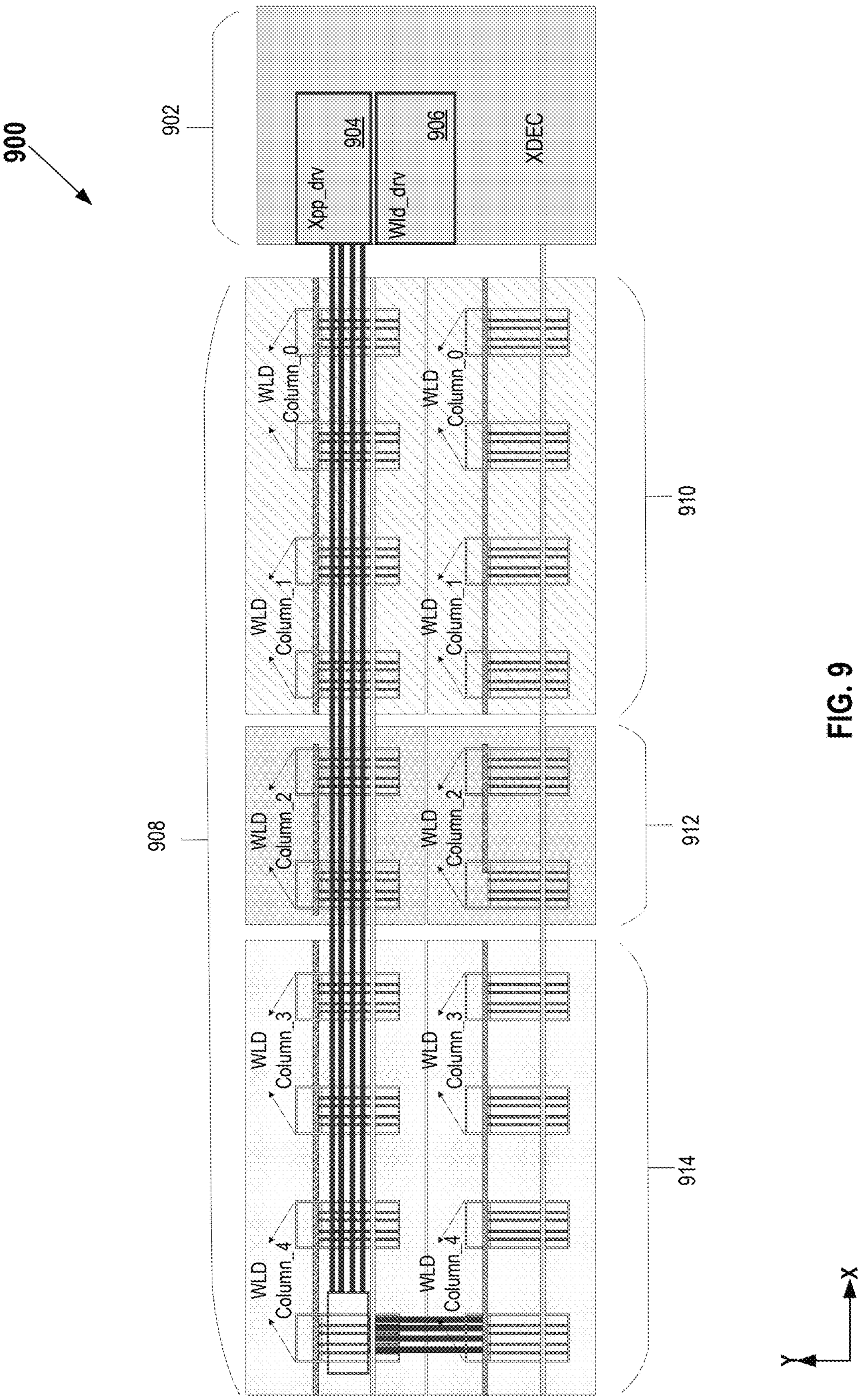
FIG. 9 is a plan view of an array of memory groups and an associated X-decoder circuit that includes circuitry for generating voltages for driving the word lines of the memory groups in common.

FIG. 9 is a plan view of a portion of a memory device 900 including a memory structure, and a peripheral circuit structure stacked on the memory structure. The memory structure can include a plurality of memory banks, and each memory bank can include an array of memory groups 908. FIG. 9 shows a pair of first memory groups 910, a pair of second memory groups 912, and a pair of third memory groups 914.

The peripheral circuit structure can include an X-decoder circuit 902 located between adjacent memory banks, and can include precharge-voltage-driver circuit 904 and a discharge-voltage-driver circuit 906 coupled with the memory groups 908. Since both precharge-voltage-driver circuit 904 and discharge-voltage-driver circuit 906 are located in the space between adjacent memory banks, the X-decoder circuit 902 may occupy a relatively larger area. Note that FIG. 9 shows interconnect lines that run continuously from X-decoder circuit 902 through a row of memory groups 910, 912 and 914. In some implementations, each precharge-voltage-driver circuit 904 is configured to provide a precharge voltage to the word lines of the at least one memory block of the corresponding one of the plurality of memory groups. In some implementations, each discharge-voltage-driver circuit 906 is configured to provide a discharge voltage to the word lines of the at least one memory block of the corresponding one of the plurality of memory groups. Various implementations, in accordance with this disclosure, distribute the functions of precharge-voltage-driver circuit 904, and a discharge-voltage-driver circuit 906, among spaces available in the memory groups, thus reducing the area consumed by the X-decoder circuit. This area-efficient arrangement may reduce the size of the memory array structure.

Figure 10A:
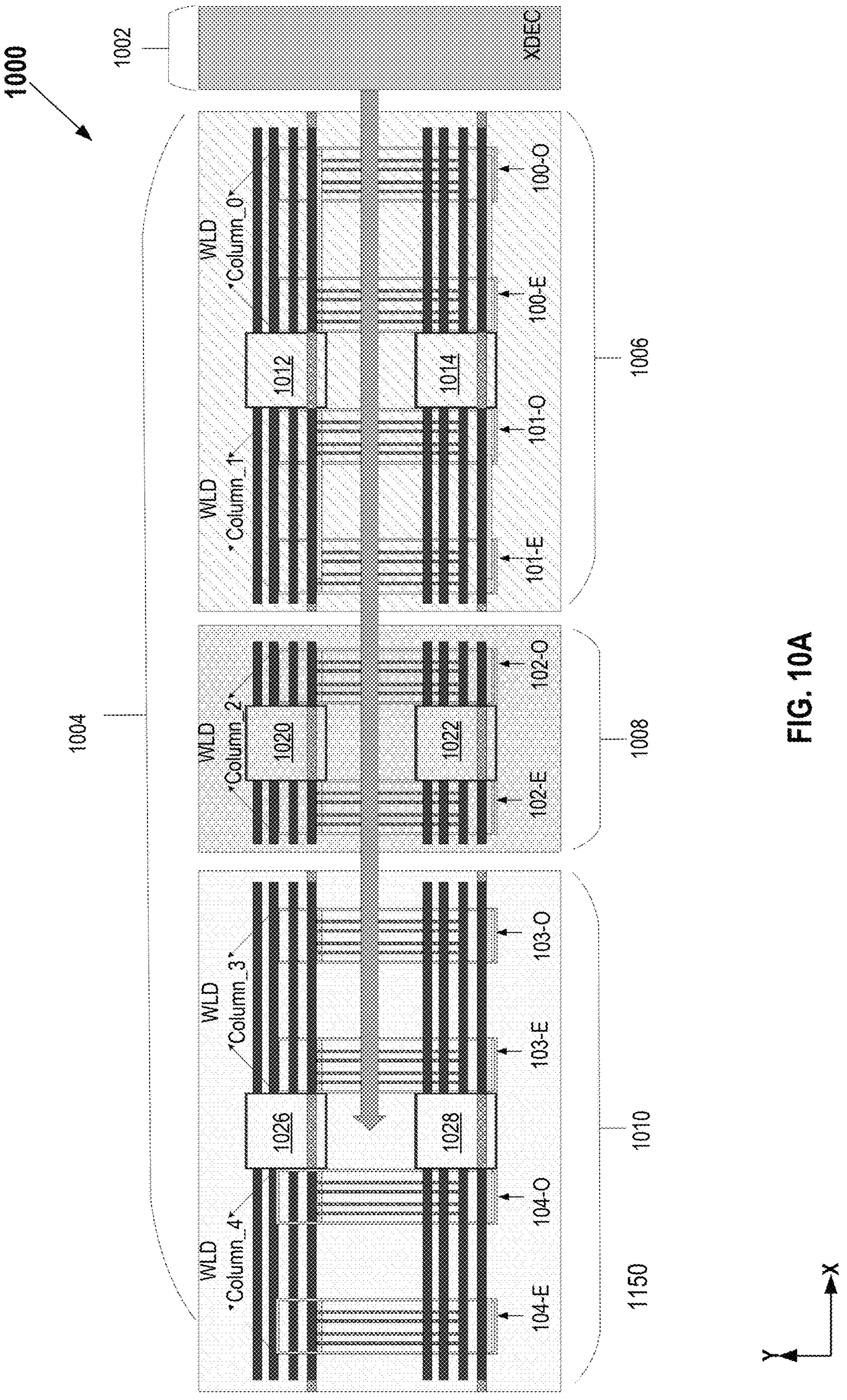
FIG. 10A is a plan view of an illustrative array of memory groups in accordance with this disclosure.

FIG. 10A is a plan view of a portion of a memory device 1000. Memory device 1000 includes a memory array structure and a peripheral structure bonded with it such that they are vertically stacked with each other. The memory array structure includes memory blocks, which, in turn, include memory cells. The peripheral structure includes circuitry (such as, but not limited to, CMOS circuitry) and interconnect lines. Electrical signals pass between the peripheral structure and the memory array structure through bonding contacts (see FIGS. 1A-1D).

Memory device 1000 has an X-decoder circuit 1002, and an array of memory groups 1004 in accordance with this disclosure. It is noted that FIG. 10A shows a single row of the memory groups 1004 in the array for simple illustrative implementation and description. Although a single row is illustrated in FIG. 10A and described herein, various other implementations in accordance with this disclosure are not limited to any particular number of rows. The array of memory groups 1004 includes a first memory group 1006, a second memory group 1008, and a third memory group 1010. Each memory group includes at least one memory block. Implementations in accordance with this disclosure are not limited to having three memory groups, and various implementations may have more or fewer memory groups. Further, memory groups in any particular implementation may have the same or a different number of memory blocks.

Still referring to FIG. 10A, first memory group 1006 can be coupled with WLD circuits 100-O, 100-E, 101-O, 101-E, and be coupled with a first memory-group-driver circuit. In some implementations, the first memory-group-driver circuit can include a precharge-voltage-driver circuit 1012 and a discharge-voltage-driver circuit 1014 that are coupled with the WLD circuit 614, and can be located between the column_0 of WLD circuits (including odd WLD circuit 100-O and even WLD circuit 100-E) and the column_1 of WLD circuits (including odd WLD circuit 101-O and even WLD circuit 101-E).

Second memory group 1008 can be coupled with the column_2 of WLD circuits (including the odd WLD circuit 102-O and the even WLD circuit 102-E), and be coupled with a second memory-group-driver circuit. In some implementations, the second memory-group-driver circuit can include a precharge-voltage-driver circuit 1020 and a discharge-voltage-driver circuit 1022, and can be located between the odd WLD circuit 102-O and the even WLD circuit 102-E.

Third memory group 1010 can be coupled with WLD circuits 103-O, 103-E, 104-O, 104-E, and be coupled with a third memory-group-driver circuit. In some implementations, the third memory-group-driver circuit can include a precharge-voltage-driver circuit 1026 and a discharge-voltage-driver circuit 1028, and can be located between the column_3 of WLD circuits (including odd WLD circuit 103-O and even WLD circuit 103-E) and the column_4 of WLD circuits (including odd WLD circuit 104-O and even WLD circuit 104-E).

As shown in FIG. 10A, precharge-voltage-driver circuits 1012, 1020, and 1026 are located overlapping with the memory groups in the vertical direction rather than being disposed within the X-decoder circuit as shown in FIG. 9. Likewise, discharge-voltage-driver circuits 1014, 1022, and 1028 are located overlap with the memory groups in the vertical direction rather than being disposed within the X-decoder circuit as shown in FIG. 9. In other words, a projection of the first memory-group-driver circuit including the precharge-voltage-driver circuit 1012 and discharge-voltage-driver circuit 1014 may be overlapped with portions of the first memory group 1006 in a lateral plane, a projection of the second memory-group-driver circuit including precharge-voltage-driver circuit 1020 and discharge-voltage-driver circuit 1022 may be overlapped with portions of the second memory group 1008 in the lateral plane, and a projection of the third memory-group-driver circuit including the precharge-voltage-driver circuit 1026 and discharge-voltage-driver circuit 1028 may be overlapped with portions of the third memory group 1010 in the lateral plane.

Figure 10B:
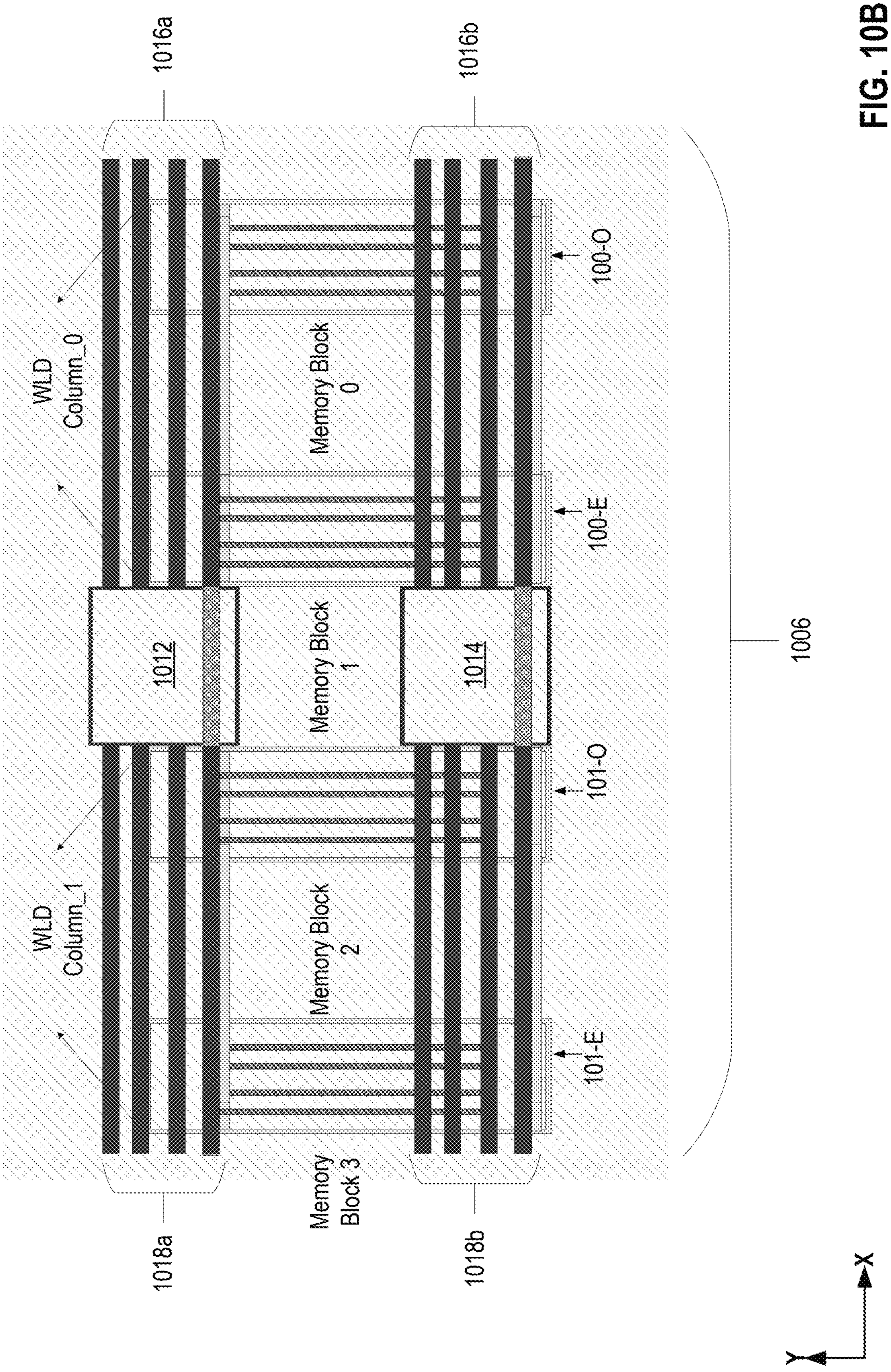
FIG. 10B is a plan view of an illustrative memory group in accordance with this disclosure.

FIG. 10B is an enlarged plan view of first memory group 1006, in accordance with this disclosure. In this illustrative implementation, first memory group 1006 includes a first memory block (Memory Block 0), a second memory block (Memory Block 1), a third memory block (Memory Block 2), and a first portion of a fourth memory block (i.e., a first portion of Memory Block 3). In accordance with this disclosure, the memory-group-driver-interconnect lines 1016*a*, 1016*b*, 1018*a*, and 1018*b* coupled with the first memory-group-driver circuit including the precharge-voltage-driver circuit 1012 and discharge-voltage-driver circuit 1014 can be connected to one parity of word lines (i.e., only even word lines or only odd word lines), while the memory-group-driver-interconnect lines coupled with an adjacent group-driver circuit of an adjacent row of memory groups can be connected to only the opposite parity word lines. Note that, unlike the configuration illustrated in FIG. 9, memory-group-driver-interconnect lines 1016*a*, 1016*b*, 1018*a*, and 1018*b* do not extend beyond the boundaries of memory group 1006 to other memory groups. Memorygroup-driver-interconnect lines 1016*a*, 1016*b*, 1018*a*, and 1018*b* occupy a set of horizontal routing channels.

Figure 10C:
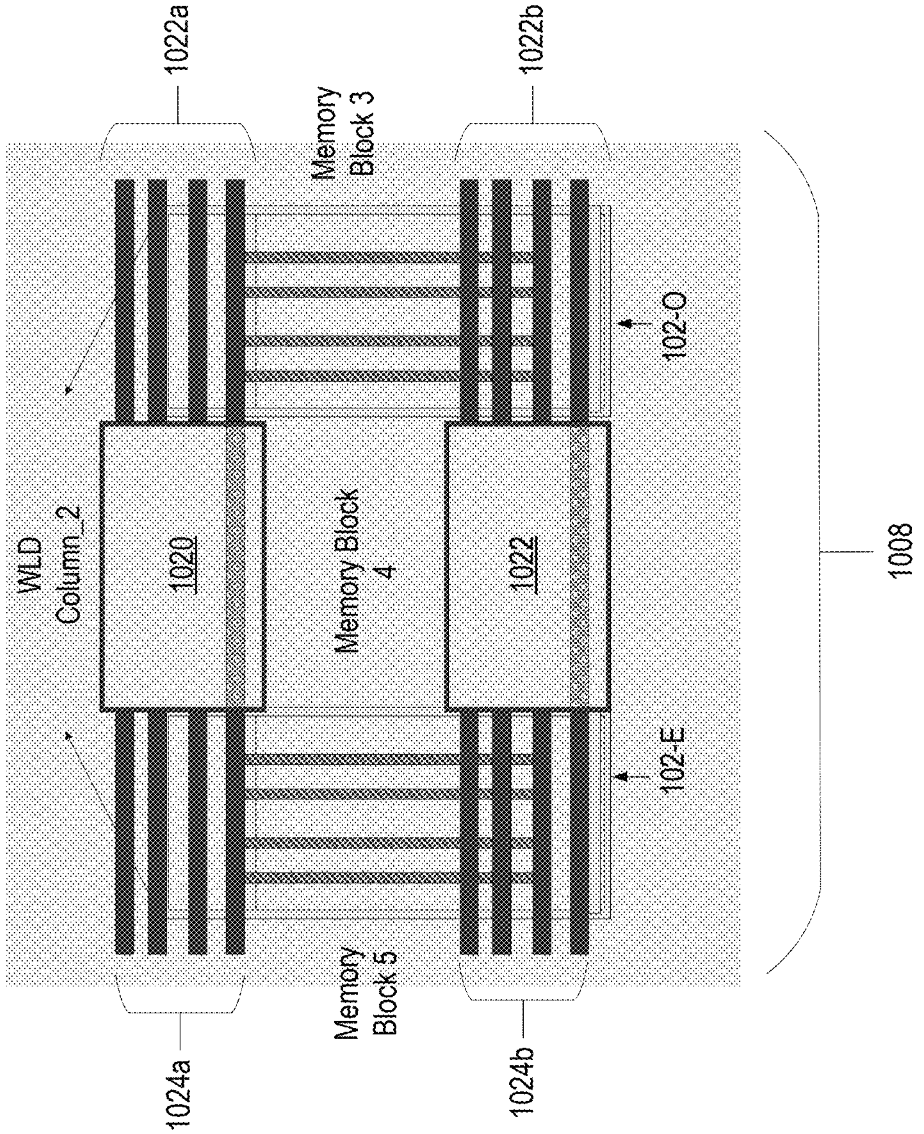
FIG. 10C is a plan view of another illustrative memory group in accordance with this disclosure.

FIG. 10C is an enlarged plan view of second memory group 1008, in accordance with this disclosure. Second memory group 1008 includes a second portion of the fourth memory block (i.e., a second portion of Memory Block 3), a fifth memory block (Memory Block 4), and a first portion of a sixth memory block (i.e., a first portion of Memory Block 5). In accordance with this disclosure, the memory-group-driver-interconnect lines 1022*a*, 1022*b*, 1024*a*, and 1024*b* coupled with the second memory-group-driver circuit including the precharge-voltage-driver circuit 1020 and discharge-voltage-driver circuit 1022 can be connected to one parity of word lines (i.e., only even word lines or only odd word lines), while the memory-group-driver-interconnect lines coupled with an adjacent group-driver circuit of an adjacent row of memory groups can be connected to only the opposite parity word lines. Note that, unlike the configuration illustrated in FIG. 9, memory-group-driver-interconnect lines 1022*a*, 1022*b*, 1024*a*, and 1024*b* do not extend beyond the boundaries of memory group 1008 to other memory groups. Memory-group-driver-interconnect lines 1022*a*, 1022*b*, 1024*a*, and 1024*b* occupy a set of horizontal routing channels.

Figure 10D:
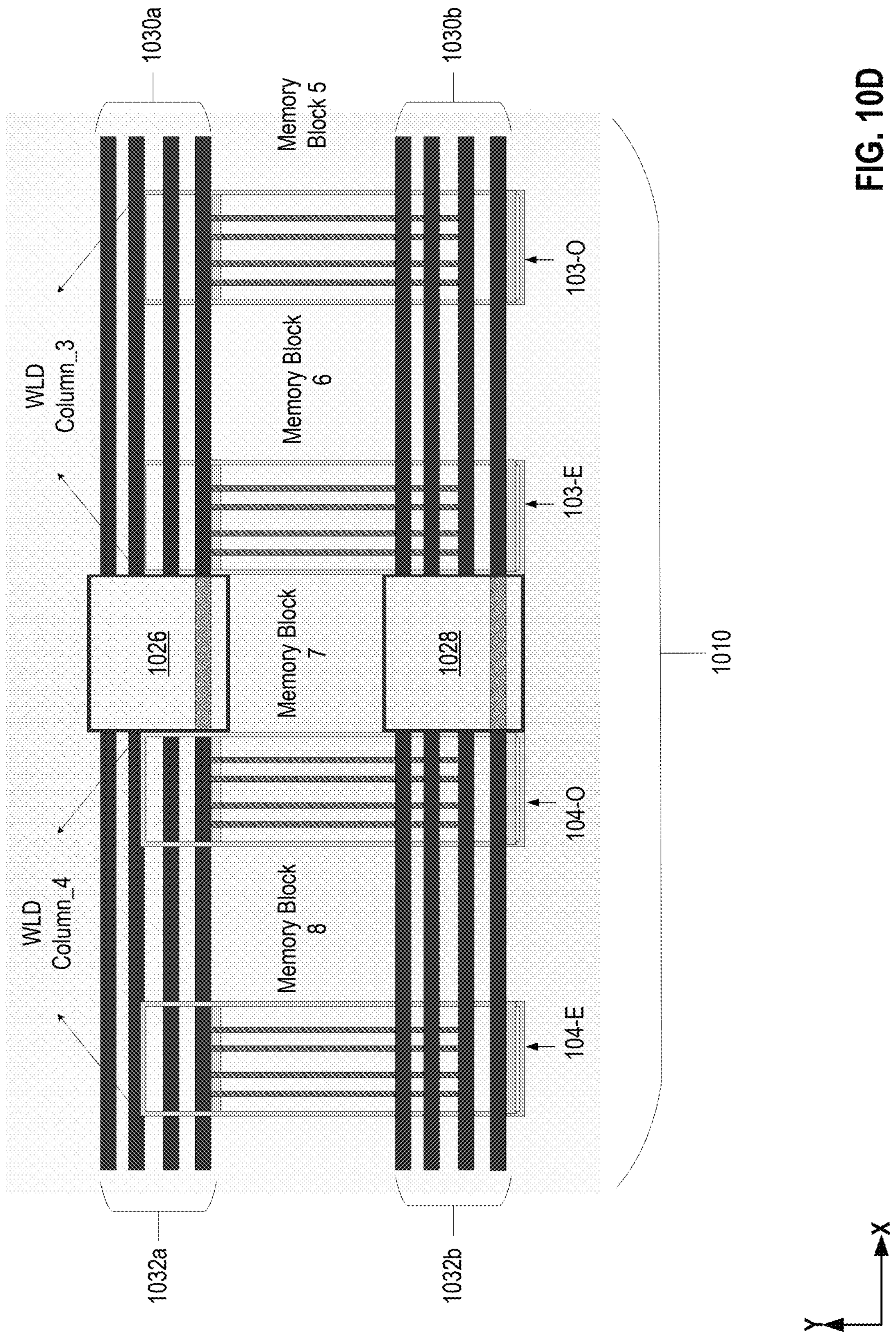
FIG. 10D is a plan view of another illustrative memory group in accordance with this disclosure.

FIG. 10D is an enlarged plan view of third memory group 1010, in accordance with this disclosure. Third memory group 1010 includes a second portion of the sixth memory block (i.e., a second portion of Memory Block 5), a seventh memory block (Memory Block 6), an eighth memory block (Memory Block 7), and a ninth memory block (Memory Block 8). In accordance with this disclosure, the memory-group-driver-interconnect lines 1030*a*, 1030*b*, 1032*a*, and 1032*b* coupled with the third memory-group-driver circuit including the precharge-voltage-driver circuit 1026 and discharge-voltage-driver circuit 1028 is coupled with the WLD circuit which can be connected to one parity of word lines (i.e., only even word lines or only odd word lines), while the memory-group-driver-interconnect lines coupled with an adjacent group-driver circuit of an adjacent row of memory groups can be connected to only the opposite parity word lines. Note that, unlike the configuration illustrated in FIG. 9, memory-group-driver-interconnect lines 1030*a*, 1030*b*, 1032*a*, and 1032*b* do not extend beyond the boundaries of memory group 1010 to other memory groups. Memory-group-driver-interconnect lines 1030*a*, 1030*b*, 1032*a*, and 1032*b* occupy a set of horizontal routing channels.

Referring to FIGS. 10B-10D, the memory-group-driver-interconnect lines of the first memory group 1006 occupy the same horizontal routing channel as the memory-group-driver-interconnect lines of the second memory group 1008, and the same horizontal routing channel as the memory-group-driver-interconnect lines of the third memory group 1010. Even though the memory-group-driver-interconnect lines of the first, second, and third memory groups occupy the same horizontal routing channel, they do not connect with each other. That is, each set of memory-group-driver-interconnect lines is contained within the boundaries of its respective memory group (see FIG. 10A). Therefore, the number of horizontal routing channels required for each row of memory groups can be reduced.

Figure 11:
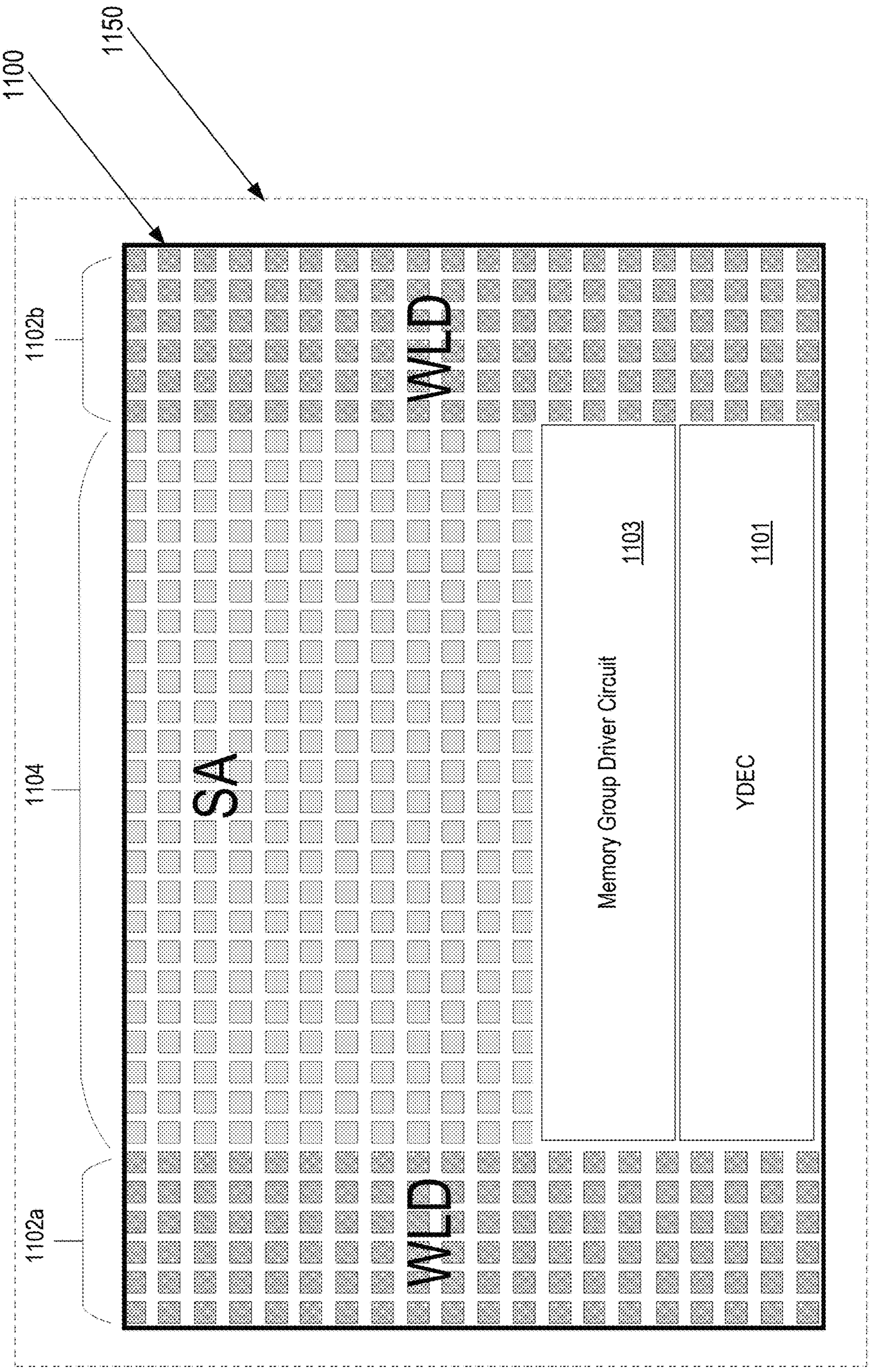
FIG. 11 illustrates a configuration of the Y-decoder circuit, sense amplifier circuit, word-line-driver circuits, and memory-group-driver circuits, in accordance with this disclosure.
Figure 12:
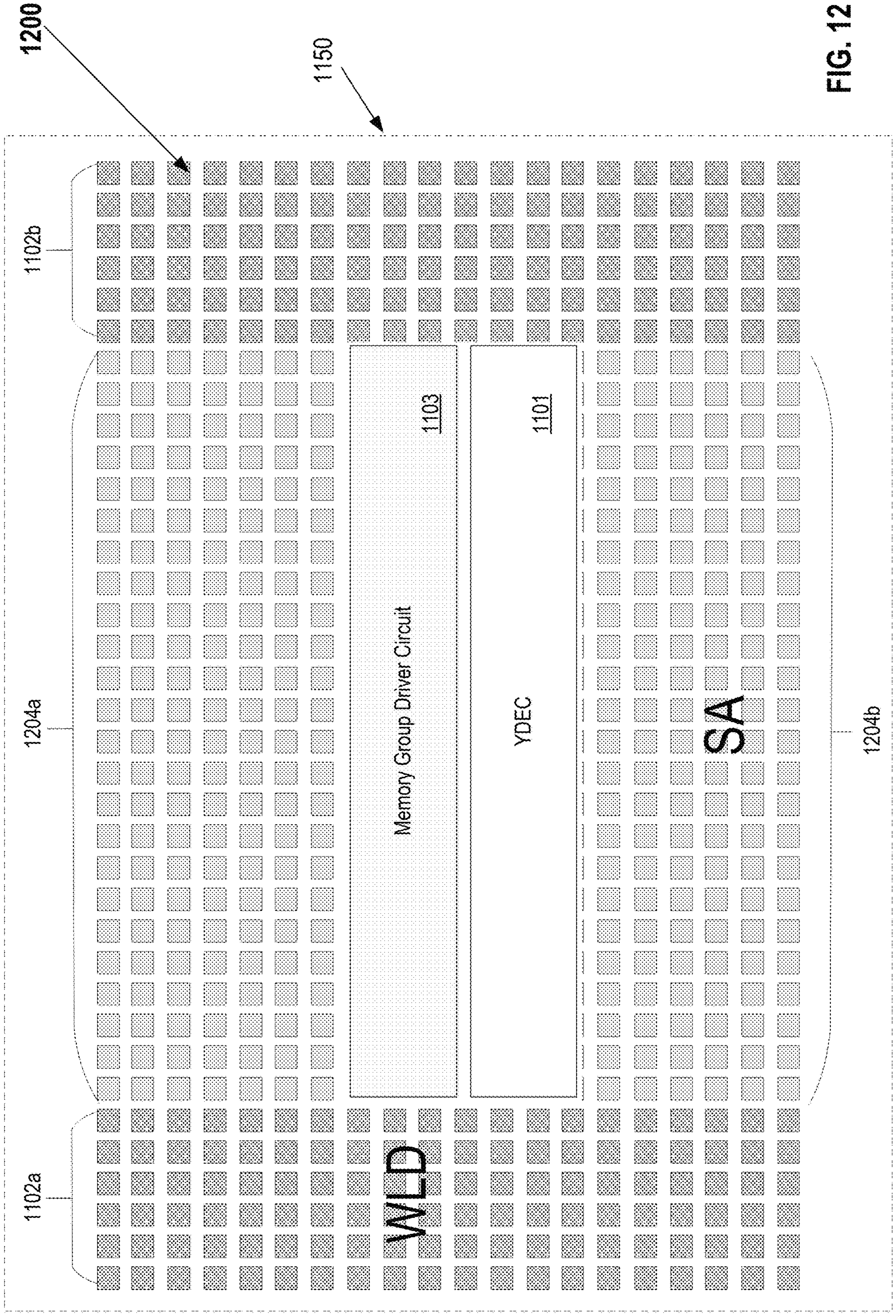
FIG. 12 illustrates another configuration of the Y-decoder circuit, sense amplifier circuit, word-line-driver circuits, and memory-group-driver circuits, in accordance with this disclosure.
Figure 13:
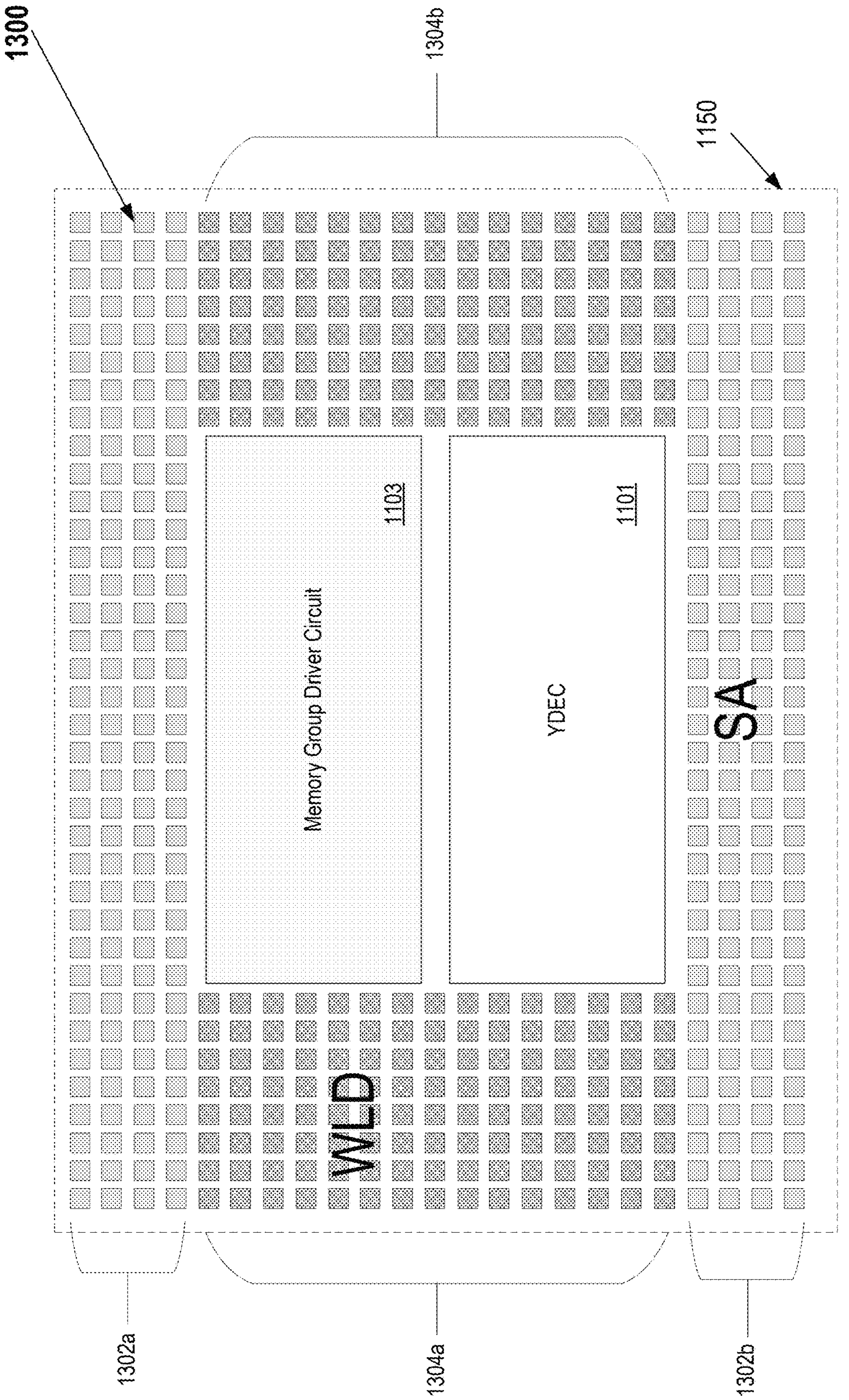
FIG. 13 illustrates a further configuration of the Y-decoder circuit, sense amplifier circuit, word-line-driver circuits, and memory-group-driver circuits, in accordance with this disclosure.

FIGS. 11-13 illustrate various configurations, in accordance with this disclosure, of Y-decoder circuits, sense amplifier circuits, word-line-driver circuits, and areas, referred to herein as conjunction areas, for the implementation of memory-group-driver circuits such as precharge-voltage-driver circuits and discharge-voltage-driver circuits. FIG. 11 illustrates a configuration 1100 including a Y-decoder 1101, a first subset of word-line-driver circuits 1102*a*, a second subset of word-line-driver circuits 1102*b*, a memory-group-driver 1103, and a sense amplifier circuit 1104. In configuration 1100, Y-decoder 1101, memory-group-driver 1103, and sense amplifier circuit 1104, are sandwiched between the first subset of word-line-driver circuits 1102*a*, and the second subset of word-line-driver circuits 1102*b*. Further, in configuration 1100, memory-group-driver 1103 is sandwiched between sense amplifier circuit 1104 and Y-decoder 1101. In some implementations, Y-decoder 1101, memory-group-driver 1103, and sense amplifier circuit 1104, overlap with a corresponding memory block along the vertical direction. That is, projections of Y-decoder 1101, memory-group-driver 1103, and sense amplifier circuit 1104, can be completely covered by a projection of the corresponding memory block in a lateral plane. In some implementations, the word-line-driver circuits 1102*a* and 1102*b* can be located between adjacent memory blocks in a view along the vertical direction. That is, the projections of word-line-driver circuits 1102*a* and 1102*b* do not overlap with projections of memory blocks in the lateral plane.

FIG. 12 illustrates an alternative configuration 1200 including Y-decoder 1101, first subset of word-line-driver circuits 1102*a*, a second subset of word-line-driver circuits 1102*b*, a memory-group-driver 1103, and a first portion of a sense amplifier circuit 1204*a* and a second portion of the sense amplifier circuit 1204*b*. In configuration 1200, Y-decoder 1101, memory-group-driver 1103, first portion of sense amplifier circuit 1204*a* and second portion of sense amplifier circuit 1204*b*, are sandwiched between the first subset of word-line-driver circuits 1102*a*, and the second subset of word-line-driver circuits 1102*b*. Further, in configuration 1200, Y-decoder 1101, and memory-group-driver 1103, are sandwiched between the first portion of sense amplifier circuit 1204*a* and second portion of sense amplifier circuit 1204*b*. In some implementations, Y-decoder 1101, memory-group-driver 1103, and sense amplifier circuit 1204*a* and 1204*b*, overlap with a corresponding memory block along the vertical direction. That is, projections of Y-decoder 1101, memory-group-driver 1103, and sense amplifier circuit 1204*a* and 1204*b*, can be completely covered by a projection of the corresponding memory block in a lateral plane. In some implementations, the word-line-driver circuits 1102*a* and 1102*b* can be located between adjacent memory blocks in a view along the vertical direction. That is, the projections of word-line-driver circuits 1102*a* and 1102*b* do not overlap with projections of memory blocks in the lateral plane.

FIG. 13 illustrates another alternative configuration 1300 including Y-decoder 1101, a first subset of word-line-driver circuits 1304*a*, a second subset of word-line-driver circuits 1304*b*, a first portion of sense amplifier circuit 1302*a*, and a second portion of sense amplifier circuit 1302*b*. In configuration 1300, Y-decoder 1101 and memory-group-driver 1103 are sandwiched between the first subset of word-line-driver circuits 1304*a* and the second subset of word-line-driver circuits 1304*b*. Further, in configuration 1300, Y-decoder 1101 and memory-group-driver 1103, the first subset of word-line-driver circuits 1304*a* and the second subset of word-line-driver circuits 1304*b*, are sandwiched between the first portion of sense amplifier circuit 1302*a*, and the second portion of sense amplifier circuit 1302*b*. In some implementations, Y-decoder 1101, memory-group-driver 1103, and portions of sense amplifier circuit 1302*a* and 1302*b*, overlap with a corresponding memory block along the vertical direction. Some other portions of the sense amplifier circuit

1302*a* and 1302*b* can be located between memory blocks in a view along the vertical direction. That is, projections of Y-decoder 1101, memory-group-driver 1103, can be completely covered by a projection of the corresponding memory block in a lateral plane. Projections of the first portion of sense amplifier circuit 1302*a* and the second portion of sense amplifier circuit 1302*b* can be partially covered by the projection of the corresponding memory block in the lateral plane. In some implementations, the word-line-driver circuits 1304*a* and 1304*b* can be located between adjacent memory blocks when viewed along the vertical direction. That is, the projections of word-line-driver circuits 1304*a* and 1304*b* do not overlap with projections of memory blocks in the lateral plane.

Figure 14:
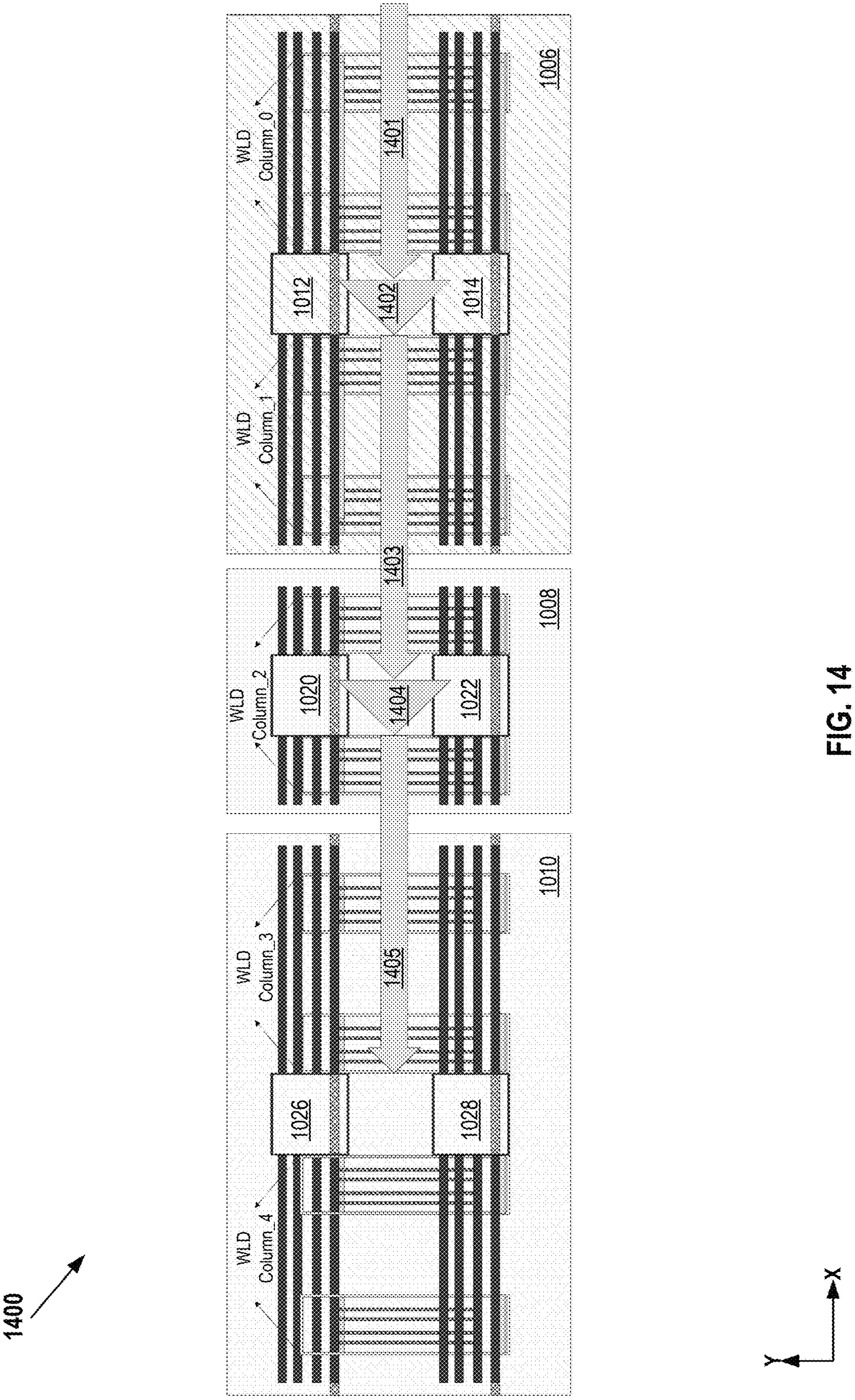
FIG. 14 is similar to FIG. 10A, but additionally shows buffer circuits.

FIG. 14 illustrates a memory device 1400 which is similar to FIG. 10A, but additionally shows buffers 1402 and 1404, and interconnect routes 1401, 1403, and 1405 for the inputs and outputs of those buffer circuits. More particularly, interconnect routes 1401 provide inputs to buffer 1402; interconnect routes 1403 couple the outputs of buffer 1402 to the input of buffer 1404; and interconnect routes 1405 carry the output of buffer 1404. In this illustrative example, buffers 1402 and 1404 are added at predetermined distances to ensure that the timing of control signals reaches each of memory groups in a timely manner.

Figure 15:
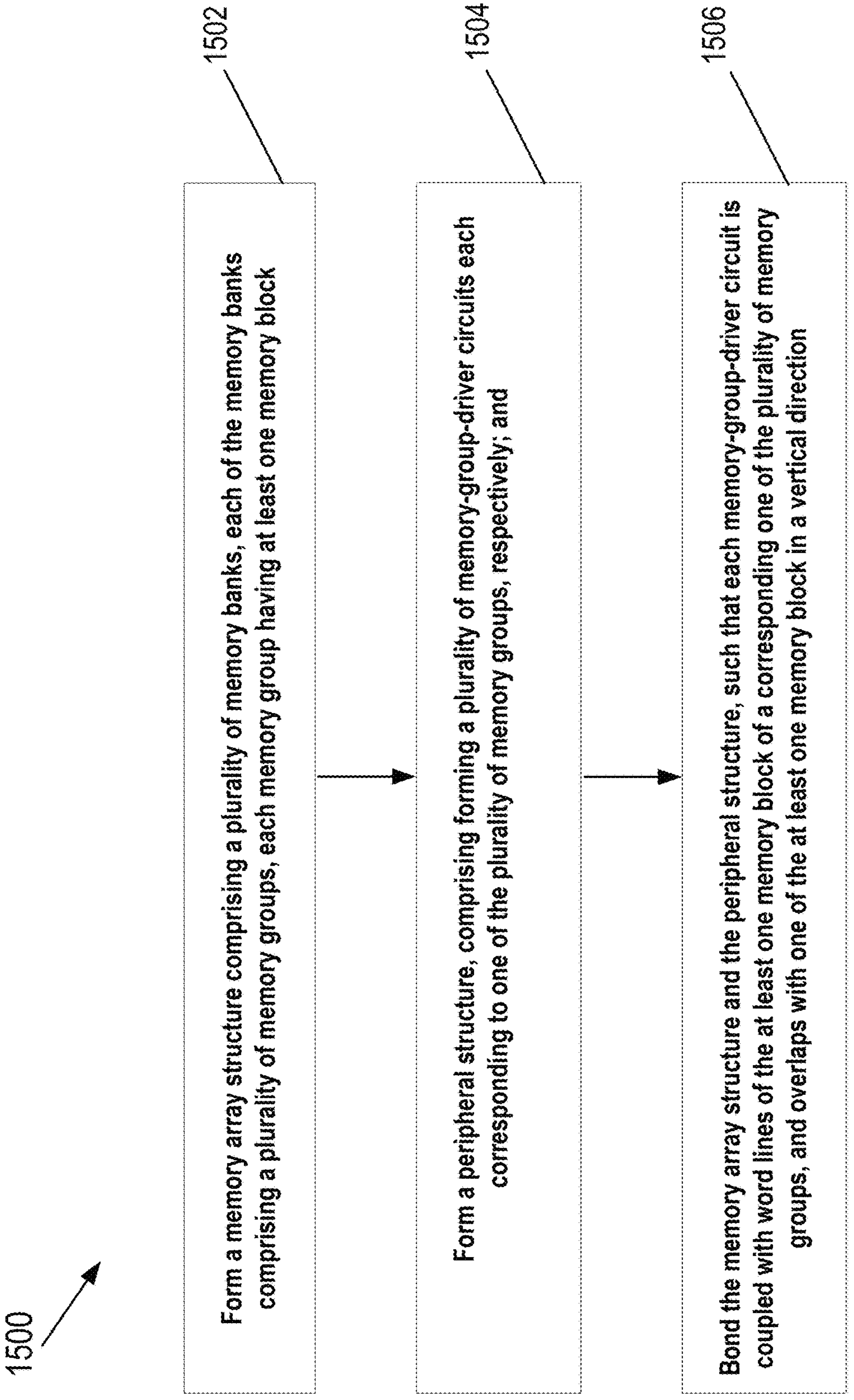
FIG. 15 is a flow diagram of a method for forming a memory device in accordance with this disclosure.

FIG. 15 is a flow diagram of a method 1500 of making a memory device. Method 1500 includes forming 1502 a memory array structure that includes a plurality of memory banks, each of the memory banks comprising a plurality of memory groups, each memory group having at least one memory block. Each memory block includes a plurality of memory cells. There are many well-known memory cell circuits, and a wide variety of physical layouts for the memory cell circuits. Various implementations of the present disclosure may correspondingly use a variety of memory cell circuit designs and physical layouts for those memory cell circuits. Design choices regarding memory cell circuits and layouts may depend on many factors including, but not limited to, the manufacturing processes available to produce the memory array structure. Memory cells in accordance with this disclosure are not limited to any particular circuit design, physical layout, or manufacturing process. In some implementations, the memory cells are DRAM cells. In some implementations the memory cells are 1T1C memory cells.

Still referring to FIG. 15, method 1500 further includes forming 1504 a peripheral structure. The peripheral structure may be manufactured with the same process as that used to manufacture the memory array structure or a different process. In some implementations, the peripheral structure is manufactured with a CMOS process. Forming the peripheral structure includes forming a plurality of memory-group-driver circuits each corresponding to one of the plurality of memory groups, respectively.

Still referring to FIG. 15, method 1500 further includes bonding 1506 the memory array structure and the peripheral structure, such that each memory-group-driver circuit is coupled with word lines of the at least one memory block of a corresponding one of the plurality of memory groups, and overlaps with one of the at least one memory blocks in a vertical direction. In some implementations bonding the memory array structure and the peripheral structure to each other is accomplished by hybrid-bonding.

Figure 16:
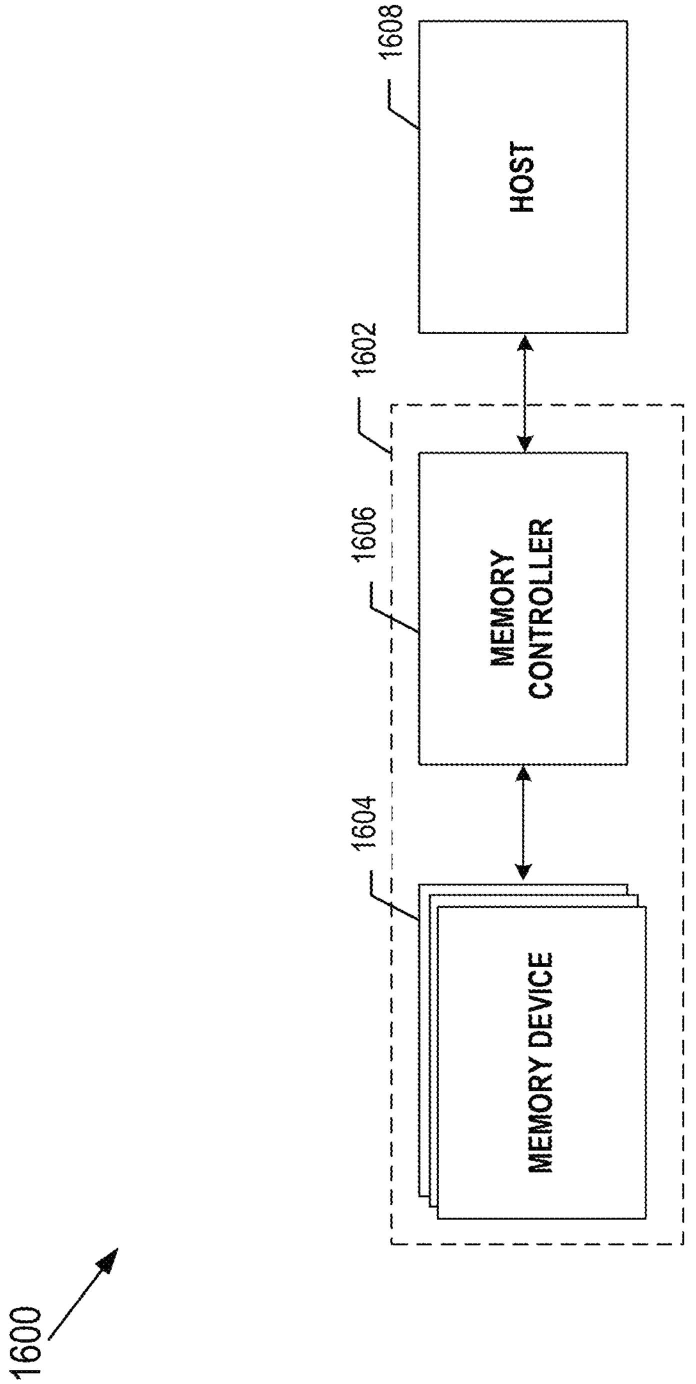
FIG. 16 is a block diagram of a memory system incorporating memory devices in accordance with this disclosure.

FIG. 16 is a block diagram of an illustrative system 1600. System 1600 includes a memory system 1602 that includes one or more memory devices 1604, and a memory controller 1606 that is coupled to memory devices 1604. System 1600 further includes a host 1608. Host 1608 may be a computational resource such as, but not limited to, a computer, a personal computer, a server, a microprocessor system, a microcontroller system, a multi-processor system, an industrial control system, a computer-based consumer electronics system, an artificial intelligence (AI) system, an automotive electronics system, an avionics system, an entertainment system, and so on. In illustrative system 1600, memory controller 1606 communicates with both memory devices 1604 and host 1608. Memory controller 1606 provides control signals to memory devices 1604, transfers data to be written from host 1608 to memory devices 1604, and transfers data to be read from memory devices 1604 to host 1608. In some systems, transferring data from memory devices 1604 to host 1608 is referred to as a "load" operation, and transferring data from host 1608 to memory device 1604 is referred to as a "store" operation. Memory controller 1606 may be configured to control memory operations such as read, write, and refresh operations. Memory controller 1606 may also be configured to manage various functions with respect to the data stored or to be stored in memory devices 1604 including, but not limited to, refresh and timing control, command/request translation, buffer and schedule, and power management. In some implementations, memory controller 1606 is further configured to determine the maximum memory capacity that the host 1608 can use, the number of memory banks, memory type and speed, and other parameters. Any other suitable functions may be performed by memory controller 1606 as well. Memory controller 1606 can communicate with an external device (e.g., host 1608) according to a particular communication protocol. For example, memory controller 1606 may communicate with the external device through at least one of various interface protocols, such as, but not limited to, a Universal Serial Bus (USB) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

FIGS. 17A-B are a flow diagram of a method 1700 of forming a memory device in accordance with this disclosure. More particularly, method 1700 provides a peripheral structure for the memory device in accordance with this disclosure. As shown in FIG. 17A, method 1700 includes forming 1702 a plurality of memory-group-driver circuits each corresponding to one of a plurality of memory groups, respectively. Method 1700 further includes forming 1704 a plurality of first memory-group-driver-interconnect lines configured to couple between a first side of each memory-group-driver circuit and even word lines of the at least one memory block of the corresponding one of the plurality of memory groups. Method 1700 further includes forming 1706 a plurality of second memory-group-driver-interconnect lines configured to couple between a second side of each memory-group-driver circuit and odd word lines of the at least one memory block of the corresponding one of the plurality of memory groups. Method 1700 further includes arranging 1708 a subset of the plurality of memory groups in a row along a first lateral direction. Method 1700 further includes arranging 1710 the plurality of the first memory-group-driver-interconnect lines and the plurality of second memory-group-driver-interconnect lines in a same subset of horizontal routing channels along the first lateral direction.

As shown in FIG. 17B, method 1700 further includes forming 1712 a plurality of word-line-driver circuits, a plurality of Y-decoder circuits, and a plurality of sense amplifier circuits such that after bonding together the memory array structure and the peripheral structure, the plurality of word-line-driver circuits are located between adjacent memory blocks, a first subset of word-line-driver circuits are connected to even word lines, a second subset of word-line driver circuits are connected to odd word lines, each Y-decoder circuit overlaps with a corresponding one memory block in the vertical direction, and each sense amplifier circuit at least partially overlaps with the corresponding one memory block in the vertical direction.

Still referring to FIG. 17B, method 1700 further includes arranging 1714 at least one sense amplifier circuit of the plurality of sense amplifier circuits, a first Y-decoder circuit of the plurality of Y-decoder circuits, and one memory-group-driver circuit so as to be sandwiched between the first subset of word-line-driver circuits and the second subset of word-line-driver circuits in the first lateral direction. And method 1700 further includes arranging 1716 the one memory-group-driver circuit so as to be sandwiched between the at least one sense amplifier circuit and the first Y-decoder circuit in a second lateral direction perpendicular to the first lateral direction.

Figure 18A:
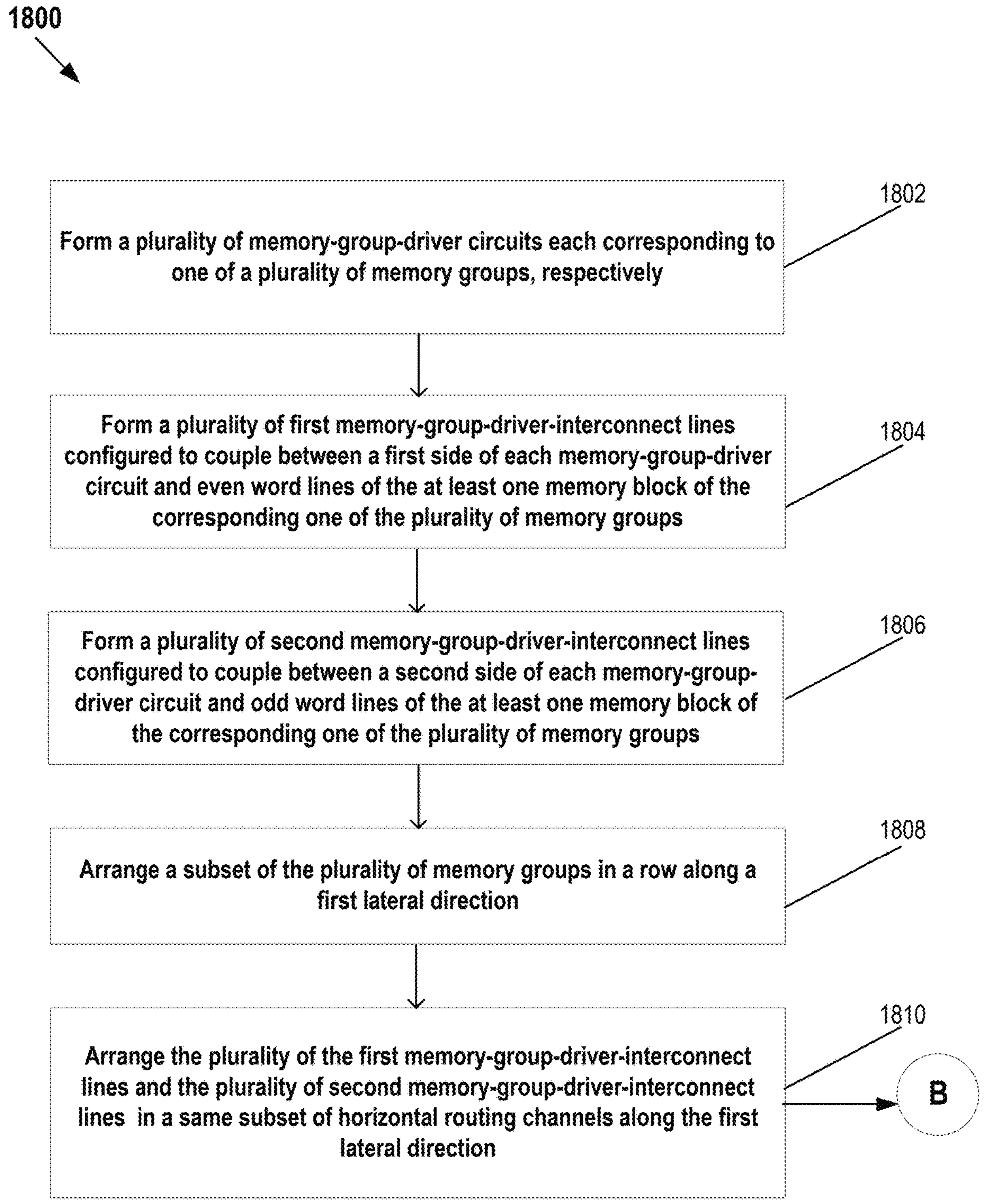

FIGS. 18A-B are a flow diagram of a method 1800 of forming a memory device in accordance with this disclosure. More particularly, method 1800 provides an alternative layout for the peripheral structure of the memory device in accordance with this disclosure. As shown in FIG. 18A, method 1800 includes forming 1802 a plurality of memory-group-driver circuits each corresponding to one of a plurality of memory groups, respectively. Method 1800 further includes forming 1804 a plurality of first memory-group-driver-interconnect lines configured to couple between a first side of each memory-group-driver circuit and even word lines of the at least one memory block of the corresponding one of the plurality of memory groups. Method 1800 further includes forming 186 a plurality of second memory-group-driver-interconnect lines configured to couple between a second side of each memory-group-driver circuit and odd word lines of the at least one memory block of the corresponding one of the plurality of memory groups. Method 1800 further includes arranging 1808 a subset of the plurality of memory groups in a row along a first lateral direction. Method 1800 further includes arranging 1810 the plurality of the first memory-group-driver-interconnect lines and the plurality of second memory-group-driver-interconnect lines in a same subset of horizontal routing channels along the first lateral direction.

As shown in FIG. 18B, method 1800 further includes forming 1812 a plurality of word-line-driver circuits, a plurality of Y-decoder circuits, and a plurality of sense amplifier circuits such that after bonding together the memory array structure and the peripheral structure, the plurality of word-line-driver circuits are located between adjacent memory blocks, a first subset of word-line-driver circuits are connected to even word lines, a second subset of word-line driver circuits are connected to odd word lines, each Y-decoder circuit overlaps with a corresponding one memory block in the vertical direction, and each sense amplifier circuit at least partially overlaps with the corresponding one memory block in the vertical direction. Method 1800 further includes arranging 1814 at least one sense amplifier circuit of the plurality of sense amplifier circuits, a first Y-decoder circuit of the plurality of Y-decoder circuits, and one memory-group-driver circuit so as to be sandwiched between the first subset of word-line-driver circuits and the second subset of word-line-driver circuits in the first lateral direction. And method 1800 further includes arranging 1816 the one memory-group-driver circuit and the first Y-decoder circuit so as to be sandwiched between a first portion of the at least one sense amplifier circuit and a second portion of the at least one sense amplifier circuit in a second lateral direction perpendicular to the first lateral direction.

Figure 19A:
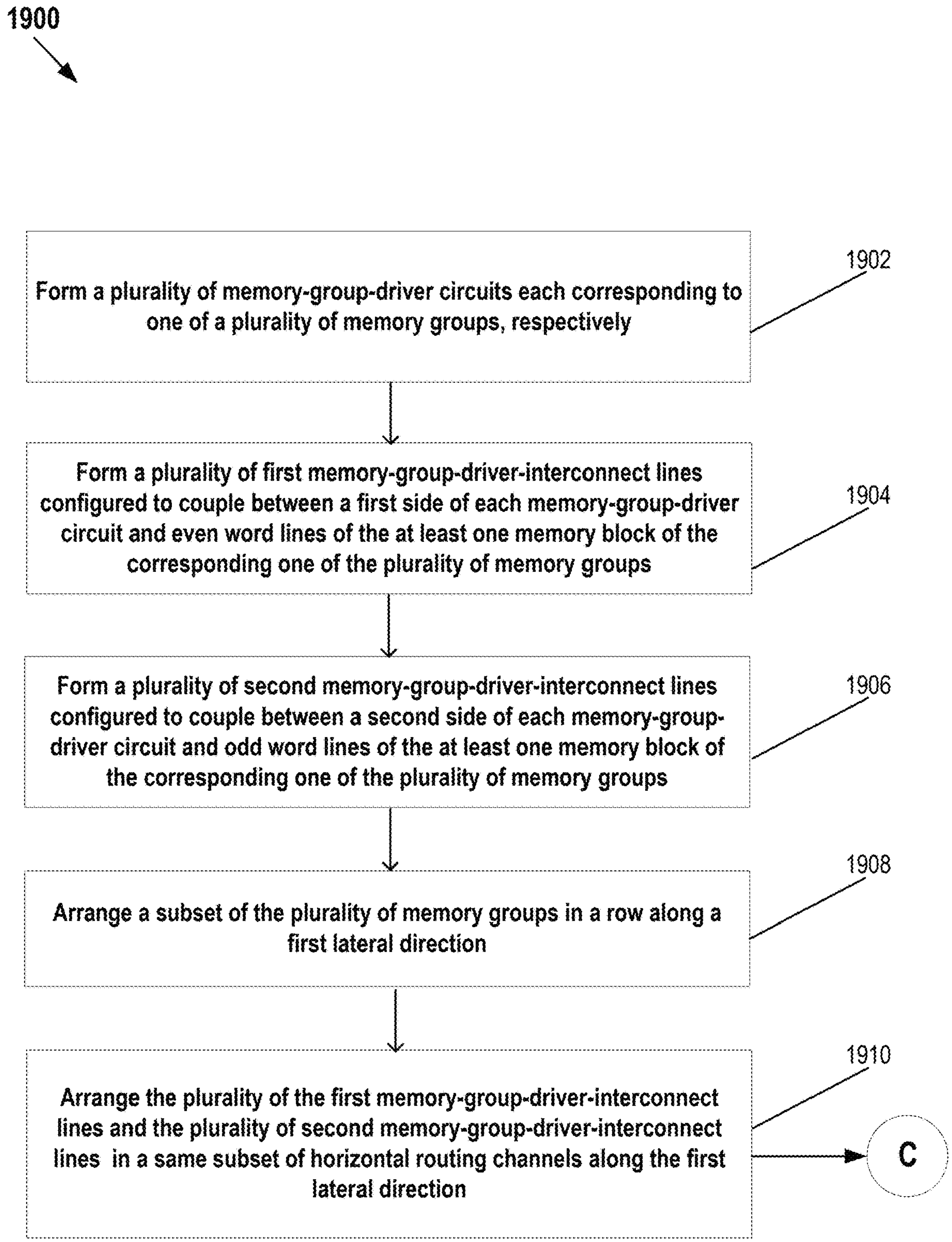

FIGS. 19A-B are a flow diagram of a method 1900 of forming a memory device in accordance with this disclosure. More particularly, method 1900 provides yet another alternative layout for the peripheral structure of the memory device in accordance with this disclosure. As shown in FIG. 19A, method 1900 includes forming 1902 a plurality of memory-group-driver circuits each corresponding to one of a plurality of memory groups, respectively. Method 1900 further includes forming 1904 a plurality of first memory-group-driver-interconnect lines configured to couple between a first side of each memory-group-driver circuit and even word lines of the at least one memory block of the corresponding one of the plurality of memory groups. Method 1900 further includes forming 1906 a plurality of second memory-group-driver-interconnect lines configured to couple between a second side of each memory-group-driver circuit and odd word lines of the at least one memory block of the corresponding one of the plurality of memory groups. Method 1900 further includes arranging 1908 a subset of the plurality of memory groups in a row along a first lateral direction. Method 1900 further includes arranging 1910 the plurality of the first memory-group-driver-interconnect lines and the plurality of second memory-group-driver-interconnect lines in a same subset of horizontal routing channels along the first lateral direction. Method 1900 further includes forming 1912 a plurality of word-line-driver circuits, a plurality of Y-decoder circuits, and a plurality of sense amplifier circuits such that after bonding together the memory array structure and the peripheral structure, the plurality of word-line-driver circuits are located between adjacent memory blocks, a first subset of word-line-driver circuits are connected to even word lines, a second subset of word-line driver circuits are connected to odd word lines, each Y-decoder circuit overlaps with a corresponding one memory block in the vertical direction, and each sense amplifier circuit at least partially overlaps with the corresponding one memory block in the vertical direction.

Referring to FIG. 19B, method 1900 further includes arranging 1914 a first Y-decoder circuit of the plurality of Y-decoder circuits and one memory-group-driver circuit so as to be sandwiched between the first subset of word-line-driver circuits and the second subset of word-line-driver circuits in the first lateral direction. And, method 1900 further includes arranging 1916 the plurality of word-line-driver circuits, the one memory-group-driver circuit, and the first Y-decoder circuit so as to be sandwiched between a first portion of the sense amplifier circuits and a second portion of the sense amplifier circuits in a second lateral direction perpendicular to the first lateral direction.

The foregoing description of the specific implementations will so reveal the general nature of the present disclosure that others can, by applying knowledge within the skill of the art, readily modify and/or adapt for various applications of such specific implementations, without undue experimentation, and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all implementations of the present disclosure as contemplated by the inventor(s), and thus, are not intended to limit the present disclosure and the subjoined claims in any way.

The breadth and scope of the present disclosure should not be limited by any of the above-described illustrative implementations, but should be defined only in accordance with the subjoined claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device, comprising:

a memory array structure comprising a plurality of memory banks, each of the memory banks comprising a plurality of memory groups, each memory group having at least one memory block; and a peripheral structure stacked with the memory array structure in a vertical direction, and comprising a plurality of memory-group-driver circuits each corresponding to one of the plurality of memory groups, respectively, the peripheral structure comprising:

a plurality of memory-group-driver-interconnect lines coupled with a corresponding memory-group-driver circuit and one parity of word lines, wherein each memory-group-driver circuit is coupled with word lines of the at least one memory block of a corresponding one of the plurality of memory groups, and overlaps with one of the at least one memory blocks in the vertical direction; and wherein a subset of the plurality of memory groups is arranged in a row along a first lateral direction, and the plurality of memory-group-driver-interconnect lines coupled with the corresponding memory-group-driver circuit of the subset of the plurality of memory groups are arranged in a same subset of horizontal routing channels along the first lateral direction.

2. The memory device of claim 1, wherein each memory-group-driver circuit comprises:

a precharge-voltage-driver circuit configured to provide a precharge voltage to the word lines of the at least one memory block of the corresponding one of the plurality of memory groups; and a discharge-voltage-driver circuit configured to provide a discharge voltage to the word lines of the at least one memory block of the corresponding one of the plurality of memory groups.

3. The memory device of claim 2, wherein:

one of the memory-group-driver circuits comprises a buffer circuit configured to buffer control signals of the precharge-voltage-driver circuit or the discharge-voltage-driver circuit; and the peripheral structure further comprises at least one X-decoder circuit coupled with the buffer circuit, wherein a first X-decoder circuit of the at least one X-decoder circuit is located on the peripheral structure, and vertically offset from a region of the memory array structure that is between two laterally adjacent memory banks.

4. The memory device of claim 1, wherein a number of the horizontal routing channels in the same subset of horizontal routing channels depends on a number of the word lines of each memory block, and is independent of a number of the memory groups in the subset of the plurality of memory groups.

5. The memory device of claim 4, wherein the peripheral structure further comprises:

a first word-line-driver circuit located on a first side of one memory block and coupled with even word lines, and a second word-line-driver circuit located on a second side of the one memory block opposite to the first side and coupled with odd word lines;

a Y-decoder circuit that overlaps with the one memory block in the vertical direction; and a sense amplifier circuit that at least partially overlaps with the one memory block in the vertical direction.

6. The memory device of claim 5, wherein:

the sense amplifier circuit, the Y-decoder circuit and one memory-group-driver circuit are arranged between the first word-line-driver circuit and the second word-line-driver circuit in the first lateral direction, and the one memory-group-driver circuit is arranged between the sense amplifier circuit and the Y-decoder circuit in a second lateral direction perpendicular to the first lateral direction.

7. The memory device of claim 5, wherein:

the sense amplifier circuit, the Y-decoder circuit and one memory-group-driver circuit are arranged between the first word-line-driver circuit and the second word-line-driver circuit in the first lateral direction, and the one memory-group-driver circuit and the Y-decoder circuit are arranged between a first portion of the sense amplifier circuit and a second portion of the sense amplifier circuit in a second lateral direction perpendicular to the first lateral direction.

8. The memory device of claim 5, wherein:

the Y-decoder circuit and one memory-group-driver circuit are arranged between the first word-line-driver circuit and the second word-line-driver circuit in the first lateral direction, and the first and second word-line-driver circuits, the one memory-group-driver circuit, and the Y-decoder circuit are arranged between a first portion of the sense amplifier circuit and a second portion of the sense amplifier circuit in a second lateral direction perpendicular to the first lateral direction.

9. A method of forming a memory device, comprising:

forming a memory array structure comprising a plurality of memory banks, each of the memory banks comprising a plurality of memory groups, each memory group having at least one memory block, comprising:

arranging a subset of the plurality of memory groups in a row along a first lateral direction;

forming a peripheral structure, comprising:

forming a plurality of memory-group-driver circuits each corresponding to one of the plurality of memory groups, respectively;

forming a plurality of memory-group-driver-interconnect lines configured to couple with a corresponding memory-group-driver circuit and one parity of word lines;

arranging the memory-group-driver-interconnect lines coupled with the memory-group-driver circuits of the subset of the plurality of memory groups in a same subset of horizontal routing channels along the first lateral direction; and bonding the memory array structure and the peripheral structure, such that each memory-group-driver circuit is coupled with word lines of the at least one memory block of a corresponding one of the plurality of memory groups, and overlaps with one of the at least one memory block in a vertical direction.

10. The method of claim 9, wherein forming each memory-group-driver circuit comprises:

forming a precharge-voltage-driver circuit configured to provide a precharge voltage to the word lines of the at least one memory block of the corresponding one of the plurality of memory groups; and forming a discharge-voltage-driver circuit configured to provide a discharge voltage to the word lines of the at least one memory block of the corresponding one of the plurality of memory groups.

11. The method of claim 10, wherein:

forming one of the memory-group-driver circuits comprises forming a buffer circuit configured to buffer control signals of the precharge-voltage-driver circuit or the discharge-voltage-driver circuit; and forming the peripheral structure further comprises forming at least one X-decoder circuit coupled with the buffer circuit, wherein after bonding the memory array structure and the peripheral structure, a first X-decoder circuit of the at least one X-decoder circuit is located on the peripheral structure, and vertically offset from a region of the memory array structure that is between two laterally adjacent memory banks.

12. The method of claim 9, wherein a number of the horizontal routing channels in the same subset of horizontal routing channels depends on a number of the word lines of each memory block, and is independent of a number of the memory groups in the subset of the plurality of memory groups.

13. The method of claim 12, wherein forming the peripheral structure further comprises:

forming a plurality of word-line-driver circuits, a plurality of Y-decoder circuits, and a plurality of sense amplifier circuits, wherein after bonding the memory array structure and the peripheral structure, the plurality of word-line-driver circuits are located between adjacent memory blocks, each Y-decoder circuit overlaps with a corresponding one memory block in the vertical direction, and each sense amplifier circuit at least partially overlaps with the corresponding one memory block in the vertical direction.

14. The method of claim 13, wherein forming the peripheral structure further comprises:

arranging at least one sense amplifier circuit of the plurality of sense amplifier circuits, a first Y-decoder circuit of the plurality of Y-decoder circuits, and one memory-group-driver circuit so as to be located between a first word-line-driver circuit and a second word-line-driver circuit in the first lateral direction; and arranging the one memory-group-driver circuit so as to be located between the at least one sense amplifier circuit and the first Y-decoder circuit in a second lateral direction perpendicular to the first lateral direction.

15. The method of claim 13, wherein forming the peripheral structure further comprises:

arranging at least one sense amplifier circuit of the plurality of sense amplifier circuits, a first Y-decoder circuit of the plurality of Y-decoder circuits, and one memory-group-driver circuit so as to be located between a first word-line-driver circuit and a second word-line-driver circuit in the first lateral direction; and arranging the one memory-group-driver circuit and the first Y-decoder circuit so as to be located between a first portion of the at least one sense amplifier circuit and a second portion of the at least one sense amplifier circuit in a second lateral direction perpendicular to the first lateral direction.

16. The method of claim 13, wherein forming the peripheral structure further comprises:

arranging a first Y-decoder circuit of the plurality of Y-decoder circuits and one memory-group-driver circuit so as to be located between a first word-line-driver circuit and a second word-line-driver circuit in the first lateral direction; and arranging the first and second word-line-driver circuits, the one memory-group-driver circuit, and the first Y-decoder circuit so as to be located between a first portion of the sense amplifier circuits and a second portion of the sense amplifier circuits in a second lateral direction perpendicular to the first lateral direction.

17. A memory system, comprising:

a memory device, comprising:

a memory array structure comprising a plurality of memory banks, each of the memory banks comprising a plurality of memory groups, each memory group having at least one memory block, and a peripheral structure stacked with the memory array structure in a vertical direction, and comprising a plurality of memory-group-driver circuits each corresponding to one of the plurality of memory groups, respectively, the peripheral structure comprising:

a plurality of memory-group-driver-interconnect lines coupled with a corresponding memory-group-driver circuit and one parity of word lines, wherein each memory-group-driver circuit is coupled with word lines of the at least one memory block of a corresponding one of the plurality of memory groups, and overlaps with one of the at least one memory blocks in the vertical direction; and wherein a subset of the plurality of memory groups is arranged in a row along a first lateral direction, and the plurality of memory-group-driver-interconnect lines coupled with the corresponding memory-group-driver circuit of the subset of the plurality of memory groups are arranged in a same subset of horizontal routing channels along the first lateral direction; and a memory controller coupled with the memory device and configured to control the memory device.

18. The memory system of claim 17, wherein each memory-group-driver circuit comprises:

a precharge-voltage-driver circuit configured to provide a precharge voltage to the word lines of the at least one memory block of the corresponding one of the plurality of memory groups; and a discharge-voltage-driver circuit configured to provide a discharge voltage to the word lines of the at least one memory block of the corresponding one of the plurality of memory groups.

19. The memory system of claim 18, wherein:

one of the memory-group-driver circuits comprises a buffer circuit configured to buffer control signals of the precharge-voltage-driver circuit or the discharge-voltage-driver circuit; and the peripheral structure further comprises at least one X-decoder circuit coupled with the buffer circuit, wherein a first X-decoder circuit of the at least one X-decoder circuit is located on the peripheral structure, and vertically offset from a region of the memory array structure that is between two laterally adjacent memory banks.

20. The memory system of claim 17, wherein a number of the horizontal routing channels in the same subset of horizontal routing channels depends on a number of the word lines of each memory block, and is independent of a number of the memory groups in the subset of the plurality of memory groups.

* * * * *